(12) United States Patent
Salzmann et al.

(10) Patent No.: US 11,376,629 B2
(45) Date of Patent: Jul. 5, 2022

(54) TACTILE VIBRATION GENERATOR

(71) Applicant: KYOCERA Corporation, Kyoto (JP)

(72) Inventors: Timm Salzmann, Dietzenbach (DE);
Zorica Kljajic, Dietzenbach (DE);
Marcel Barth, Dietzenbach (DE);
Christian Lauenstein, Dietzenbach (DE)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/150,722

(22) Filed: Jan. 15, 2021

(65) Prior Publication Data
US 2021/0237121 A1  Aug. 5, 2021

(30) Foreign Application Priority Data

Jan. 31, 2020 (DE) ......................... 102020102516.5

(51) Int. Cl.
*G06F 3/01* (2006.01)
*B06B 1/06* (2006.01)
*G06F 3/041* (2006.01)

(52) U.S. Cl.
CPC ............ *B06B 1/0648* (2013.01); *G06F 3/016* (2013.01); *G06F 3/041* (2013.01)

(58) Field of Classification Search
CPC ... A61B 17/22004; A61C 1/0007; A61C 1/07; A61C 3/03; B06B 1/0644; B06B 1/0648; B06B 1/10; B06B 2201/55; B06B 3/00; B25D 17/00; B25D 2222/15; B64D 15/16; G06F 3/016; G06F 3/041; G06F 3/01; G06F 1/1643; H01L 41/053; H01L 41/0933; H04R 17/00
See application file for complete search history.

(56) References Cited

U.S. PATENT DOCUMENTS

| | | | |
|---|---|---|---|
| 2004/0251782 A1 | 12/2004 | Johansson et al. | |
| 2010/0165794 A1* | 7/2010 | Takahashi | H04R 17/00 367/189 |
| 2012/0248935 A1* | 10/2012 | Liu | G06F 3/016 310/326 |
| 2012/0299448 A1* | 11/2012 | Liu | G06F 3/016 310/348 |
| 2012/0326568 A1* | 12/2012 | Liu | G06F 3/016 310/348 |
| 2012/0326854 A1* | 12/2012 | Liu | G06F 1/1643 340/407.1 |
| 2013/0009893 A1 | 1/2013 | Okumura et al. | |

(Continued)

FOREIGN PATENT DOCUMENTS

| | | |
|---|---|---|
| CN | 107665944 A | 2/2018 |
| EP | 2570889 A2 | 3/2013 |

(Continued)

*Primary Examiner* — Richard J Hong
(74) *Attorney, Agent, or Firm* — Procopio Cory Hargreaves and Savitch LLP

(57) ABSTRACT

A tactile vibration generator includes a supporting block, a vibration plate, and a vibration actuator. The vibration plate includes two parts. The vibration actuator is attached to a surface of the first part and the first part is not in contact with the supporting block to reduce transferring vibration to the supporting block. The second part is fixed to the supporting block.

24 Claims, 20 Drawing Sheets

(56) References Cited

U.S. PATENT DOCUMENTS

| | | | |
|---|---|---|---|
| 2014/0070667 A1* | 3/2014 | Oh | B06B 1/0644 |
| | | | 310/326 |
| 2014/0292144 A1* | 10/2014 | Son | H01L 41/053 |
| | | | 310/317 |
| 2014/0333178 A1* | 11/2014 | Liu | B06B 3/00 |
| | | | 310/323.01 |
| 2015/0155470 A1 | 6/2015 | Mori | |
| 2018/0029078 A1 | 2/2018 | Park et al. | |
| 2021/0268544 A1* | 9/2021 | Murase | G06F 3/01 |

FOREIGN PATENT DOCUMENTS

| | | |
|---|---|---|
| EP | 3435536 A1 | 1/2019 |
| JP | 2000-78692 A | 3/2000 |
| JP | 2004-130270 A | 4/2004 |
| JP | 2007-300426 A | 11/2007 |
| JP | 2008-125005 A | 5/2008 |
| JP | 2015-149632 A | 8/2015 |
| JP | 2017-227971 A | 12/2017 |
| JP | 2018-46487 A | 3/2018 |
| KR | 10-2014-0078531 A | 6/2014 |
| WO | 2013/150807 A1 | 10/2013 |

\* cited by examiner

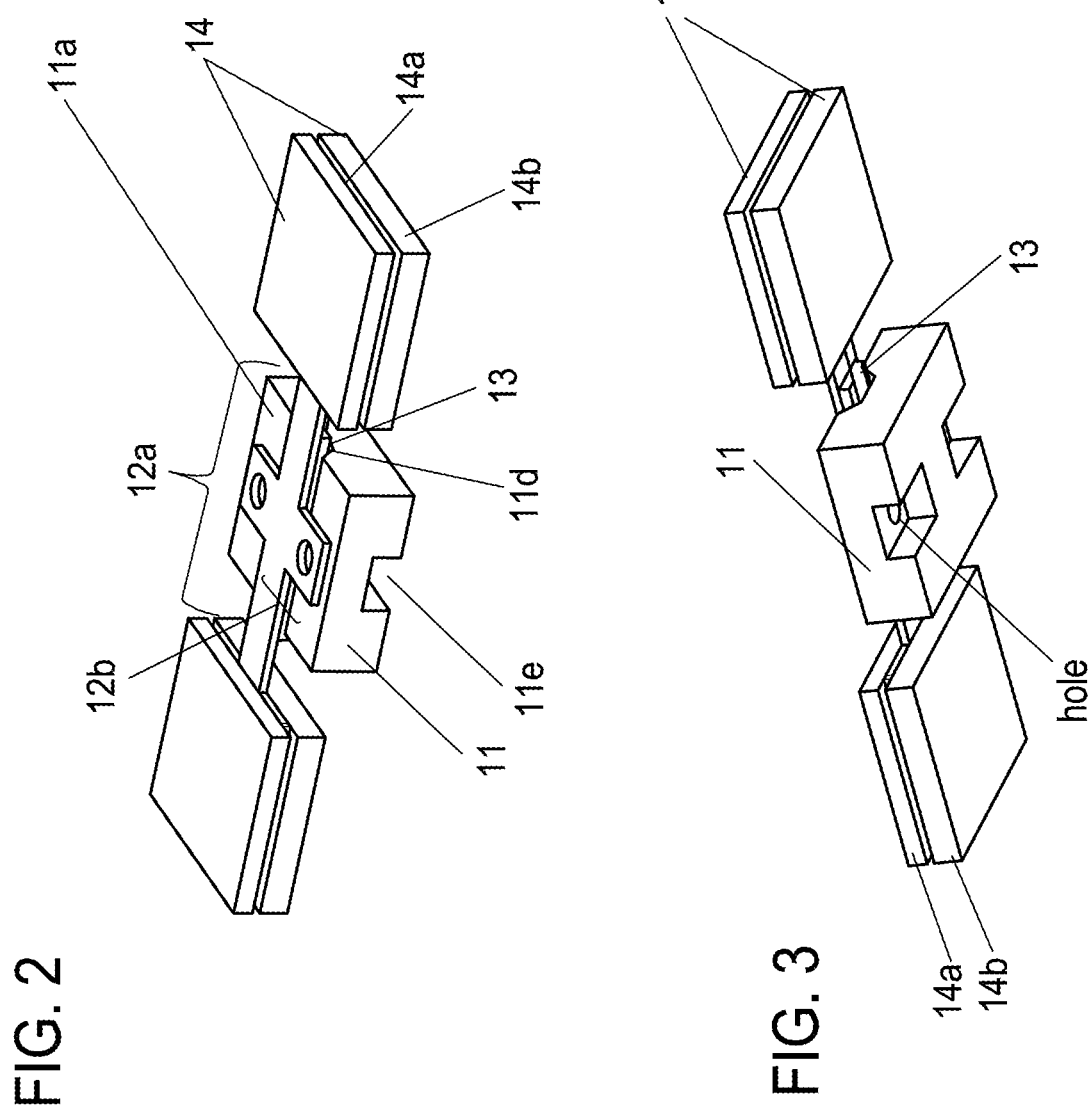

TACTILE VIBRATION GENERATOR

CROSS-REFERENCE TO RELATED APPLICATION

This application claims priority to German Patent Application No. 102020102516.5, which was filed on Jan. 31, 2020, the contents of which are incorporated herein by reference in its entirety.

TECHNICAL FIELD

The present disclosure relates to a tactile vibration generator.

BACKGROUND

Recently, it is popular for mobile information apparatuses such as smartphones and tablet PCs to be equipped with touch panels which provide a tactile sensation by vibrating. Further, the touch panels as described above are increasingly mounted on various consumer appliances including home appliances such as microwaves, televisions, and lighting equipment, as well as various industrial equipment such as automated teller machines, automatic ticket machines, and vending machines.

A typical conventional technology is described in, for example, JP2007-300426A (PTL 1) and JP2017-227971A (PTL 2) set forth below. PTL 1 discloses a tactile vibration generator providing apparatus equipped with a panel such as a touch panel. A piezoelectric vibrator 14 has a configuration in which vibration weights 11 and 12 are attached at both ends of a piezoelectric diaphragm 10 supported at a base portion 3 by two-point support. Further, the piezoelectric diaphragm 10 is connected to the touch panel 27 via a connection member 6, such that the touch panel 27 is vibrated by using the resonance of the weights 11, 12.

PTL 2 discloses a tactile presentation device having a touch panel 21. A piezoelectric element 26 having a weight 28 is attached to a surface of the touch panel 21 via a supporting member 27. The touch sensor 22 detects a pressure operation with respect to the touch panel 21, whereby a voltage is applied to the piezoelectric element 26, which in turn causes the piezoelectric element 26 to be expanded/contracted.

CITATION LIST

PTL 1: JP-A-2007-300426
PTL 2: JP-A-2017-227971

SUMMARY

Technical Problem

In the conventional technology as described above, since the piezoelectric vibrator/element is directly contacted to the supporting member supporting the touch panel, there has been a problem that the piezoelectric vibrator/element is easily breakable. Further, since the piezoelectric vibrator/element is in contact with the supporting block, the vibration of the piezoelectric vibrator/element can be transferred to the supporting block. Therefore, it is desirable to be able to provide a tactile vibration generator which is less likely to break, and in which the vibration of the piezoelectric vibrator/element is not transferred to the supporting block.

Solution to Problem

A tactile vibration generator according to the present application comprises a supporting block 11, a vibration plate 12, and a vibration actuator 13. The vibration plate 12 comprises a first part 12a, which is not in contact with the supporting block 11, and a second part 12b, which is fixed to the supporting block 11. The vibration actuator 13 is attached to a surface of the first part 12a.

Advantageous Effect

According to the present invention, since the vibration actuator 13 is attached only to the surface of the first part 12a, which is not in contact with the supporting block 11, it is possible to prevent the first part 12a, vibration actuator 13 from contacting the supporting block 11. Thus, the tactile vibration generator 1 less likely to break.

Further, since it is possible to prevent the first part 12a and the vibration actuator 13 from contacting with the supporting block 11, it is also possible to avoid that the flexural vibration of the vibration actuator 13 is released to the supporting block 11. In addition, since the vibration actuator 13 is attached to the first part 12a only, which is not contact with the supporting block 11, the vibration actuator 13 can effectively vibrate the vibration plate 12.

According to certain embodiments, the first part 12a is vibrated in a direction of flexural vibration of the vibration actuator 13 when the flexural vibration of the vibration actuator 13 is generated. Therefore, the vibration plate 12 is vibrated effectively by the vibration actuator 13.

According to certain embodiments, the vibration actuator 13 is not in contact with the supporting block 11. Therefore, the vibration actuator 13 less likely to break.

According to certain embodiments, the vibration actuator 13 is just a one vibration actuator 13. Therefore, the cost for producing the tactile vibration generator 1 is reduced.

According to certain embodiments, the vibration actuator 13 is a piezoelectric element 13. Therefore, it is possible to obtain a good tactile sensation with a human finger.

According to certain embodiments, the each of the first part 12a and second part 12b has an elongated shape, and the first part 12a and the second part 12b are at substantially right angles to each other. Since the vibration actuator 13 is attached only to the first part 12a, which is not in contact with the supporting block 11, it is possible for the vibration plate 12 to be vibrated effectively by the vibration actuator 13.

According to certain embodiments, the first part 12a and the second part 12b are at substantially right angles to each other substantially at the middle of the first part 12a and the second part 12b, respectively. Therefore, it is possible to easily provide the vibration actuator 13 in the middle portion of the supporting block 11, when the tactile vibration generator 1 is assembled.

According to certain embodiments, the length of the first part 12a in a longitudinal direction of the first part 12a is longer than the length of the second part 12b in the longitudinal direction of the second part 12b. Therefore, it is possible for the first part 12a vibrate more effectively.

According to certain embodiments, the vibration actuator 13 has an elongated shape, and the vibration actuator 13 and the first part 12a extend in a same direction. Therefore, the vibration actuator 13 can effectively vibrate the second part 12b.

According to certain embodiments, the tactile vibration generator further comprises two weights 14, wherein the first part 12a extends beyond two opposite sides of the supporting block 11 when viewed from aside of the supporting block 11 to which the second part 12b is fixed, and the two weights are attached to both ends of the first part 12a, respectively. Therefore, the vibration actuator 13 can effectively vibrate the vibration plate 12.

According to certain embodiments, each of the two weights 14 comprises a first plate weight 14a and a second plate weight 14b, and the first plate weight 14a and the second plate weight 14b sandwich an end of the first part 12a, respectively. Therefore, it is possible to more easily adjust the mass/weight of the weight 14.

According to certain embodiments, the thickness of the first plate weight 14a is different from the thickness of the second plate weight 14b. Therefore, the thickness of the weight 14 can be easily adjusted, and thus, the assembly space can be used in a more effective way.

According to certain embodiments, the second part 12b is fixed to the supporting block 11 by two fixing elements 15a, 15b, and the two fixing elements 15a, 15b are arranged at opposite sides of the vibration actuator 13. Therefore, the vibration actuator 13 is less likely to break.

According to certain embodiments, the second part 12b comprises two holes, and the two fixing elements 15a, 15b are screws. Therefore, the fixing the vibration plate 12 to the supporting block 11 is simplified.

According to certain embodiments, the supporting block 11 comprises two holes, and each of the two holes of the supporting block 11 corresponds to each of the two holes of the second part 12b. Therefore, the fixing the vibration plate 12 to the supporting block 11 is simplified.

According to certain embodiments, the vibration actuator 13 is attached to a first surface of the first part 12a, such that the vibration actuator 13 and the supporting block 11 are arranged at opposite sides of the first part 12a. Therefore, a simplified tactile vibration generator 1 is obtained.

According to certain embodiments, the supporting block 11 has two protrusions 11b, 11c on the supporting block 11, and the two holes of the supporting block 11 are formed on the two protrusions 11b, 11c respectively. Therefore, the supporting block 11 is simplified.

According to certain embodiments, the supporting block 11 comprises a channel 11d in a surface 11a of the supporting block 11, the channel 11d extends along the first part 12a, and the vibration actuator 13 is attached to a second surface of the first part 12a such that the vibration actuator 13 is arranged in the channel 11d. Since the vibration actuator 13 is attached to the first part 12a only, and arranged in the channel 11d, the vibration actuator 13 is not in contact with the supporting block 11, and thus the vibration actuator 13 is less likely to break.

According to certain embodiments, the vibration actuator 13 is attached to the first part 12a by glue. Therefore, the attachment of the vibration actuator 13 to the vibration plate 12 is simplified.

According to certain embodiments, the rigidity of the supporting block 11 is lower than the rigidity of the vibration actuator 13. Therefore, the supporting block 11 easily follows the vibration of the vibration actuator 13, and the vibration can be efficiently transmitted to the object to be vibrated.

According to certain embodiments, the supporting block 11 comprises an isotropic elastic member. Therefore, the supporting block 11 easily follows the vibration of the vibration actuator 13, and the vibration can be more efficiently transmitted to the object to be vibrated.

According to certain embodiments, the rigidity of the vibration plate 12 is lower than the rigidity of the vibration actuator 13. Therefore, the vibration plate 12 easily follows the flexural vibration of the vibration actuator 13, and thus the vibration actuator 13 is not easily broken.

According to certain embodiments, the supporting block 11 comprises a recess 11e and/or a groove 11f on a surface of the supporting block 11 different from the surface on which the second part 12b is fixed. Therefore, the supporting block 11 can easily follow the flexural vibration of the vibration actuator 13.

According to certain embodiments, a touch panel device/a display panel comprises the tactile vibration generator 1 such that it is possible to obtain the touch panel device/display panel with long lifetime.

BRIEF DESCRIPTION OF THE DRAWINGS

FIG. 2 is a perspective view illustrating a tactile vibration generator 1 without screws according to a certain embodiment.

FIG. 3 is a perspective view illustrating a tactile vibration generator 1 according to a certain embodiment.

DETAILED DESCRIPTION

In the following, certain embodiments of the present invention are described with reference to the drawings. It is to be understood, however, that the specific features described in connection with each of the described certain embodiments can be freely combined with the specific features described in connection with another one of each of the described certain embodiments unless the technical configuration of a feature is in contrast to the technical configuration of another feature. All feature combinations derived by combining features according to the above form further certain embodiments of the present invention.

Figure 1:
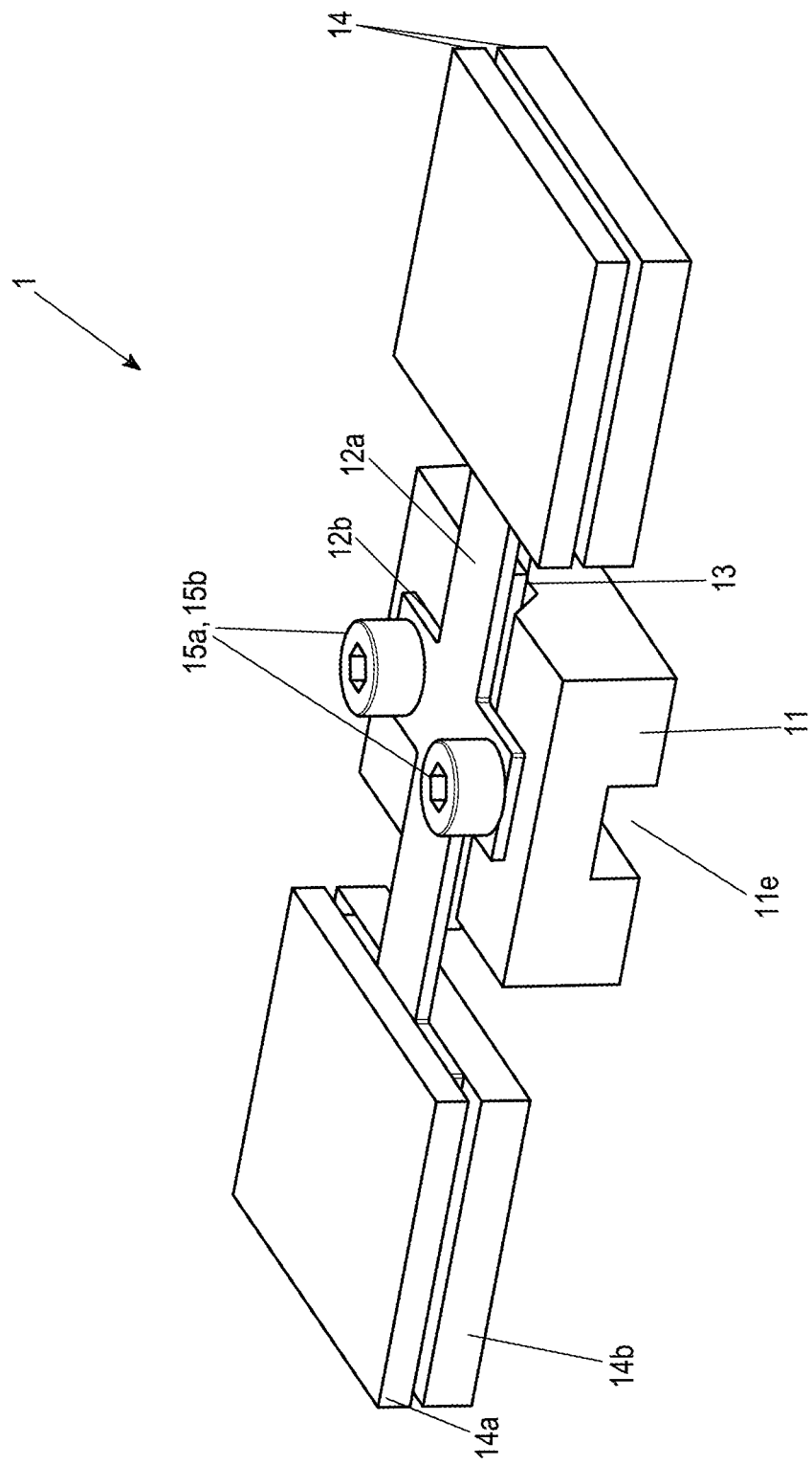
FIG. 1 is a perspective view illustrating a tactile vibration generator 1 according to a certain embodiment.

FIG. 1, 2, 3 are perspective views of the tactile vibration generator 1 according to a certain embodiment. FIG. 1 shows the tactile vibration generator 1 when it is seen from a diagonally upward direction. FIG. 2 shows the tactile vibration generator 1 without screws when it is seen from a diagonally upward direction. FIG. 3 shows the tactile vibration generator 1 when it is seen from a diagonally downward direction.

Figure 4:
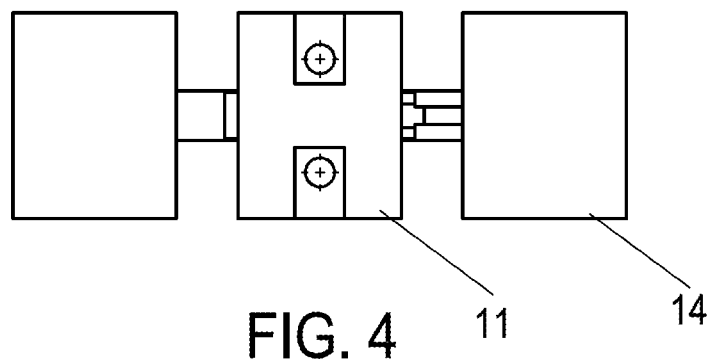
FIG. 4 is a bottom view illustrating a tactile vibration generator 1 according to a certain embodiment.
Figure 5:
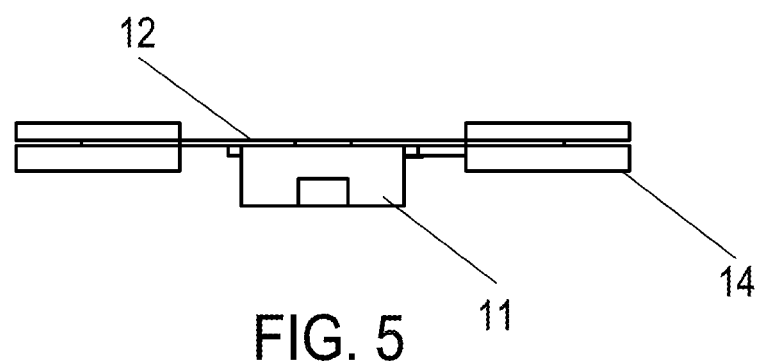
FIG. 5 is a side view illustrating a tactile vibration generator 1 without screws according to a certain embodiment.
Figure 6:
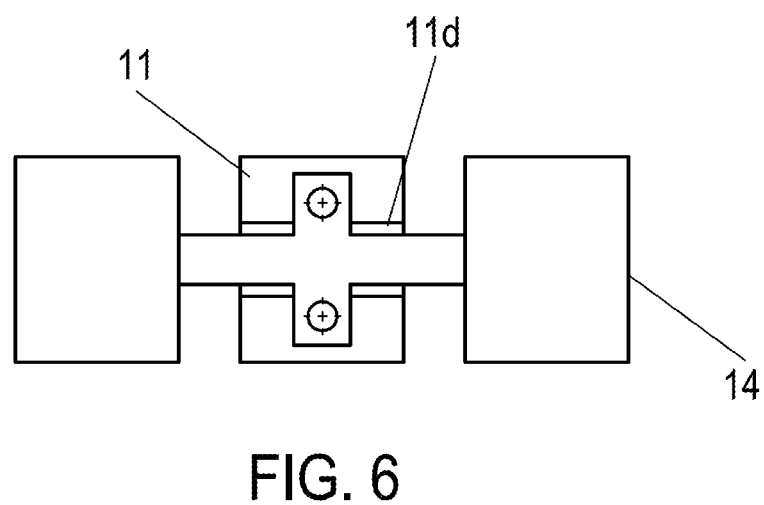
FIG. 6 is a top view illustrating a tactile vibration generator 1 according to a certain embodiment.
Figure 7:
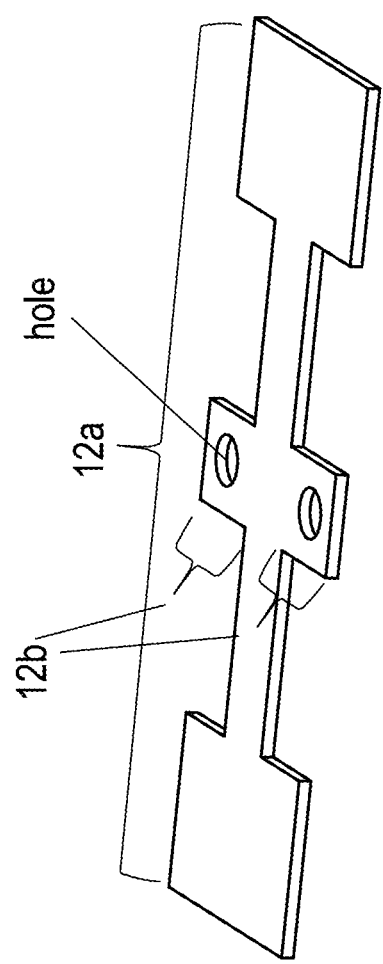
FIG. 7 is a perspective view illustrating a vibration plate 12 of the tactile vibration generator 1 according to a certain embodiment.

FIG. 4 shows the bottom of the tactile vibration generator 1 according to a certain embodiment in plan view. FIG. 5 shows the side of the tactile vibration generator 1 without screws according to a certain embodiment in plan view. FIG. 6 shows the top of the tactile vibration generator 1 according to a certain embodiment in plan view. Further, FIG. 7 shows a perspective view of a vibration plate 12 of the tactile vibration generator 1 according to a certain embodiment when it is seen from diagonally upward direction.

The tactile vibration generator 1 may be installed on an object to be vibrated such as a touch panel and a display panel. More specifically, the tactile vibration generator 1 may be installed on a side part of a main surface of a substrate such as a glass substrate constituting the touch panel or the display panel.

The tactile vibration generator 1 according to a certain embodiment comprises a supporting block 11, a vibration plate 12, a vibration actuator 13 and two weights 14.

The supporting block 11 supports the vibration actuator 13 via the vibration plate 12. The supporting block 11 also functions as a vibration transmission member for transmitting the vibration of the vibration actuator 13 to an object to be vibrated such as the display panel and the touch panel. The supporting block 11 may be in contact with the object to be vibrated (not shown in the figures) via, for example, an adhesive layer.

The supporting block 11 may be made of a porous resin containing a large number of fine spaces (i.e. having porosity). In this case, the weight of the supporting block 11 is reduced, and the supporting block 11 easily follows the vibration of the vibration actuator 13, so that the vibration can be more efficiently transmitted to the object to be vibrated. In addition, a large number of fine spaces function as cushions, and damage such as cracking of the vibrating the vibration actuator 13 can be suppressed.

The supporting block 11 may comprise an isotropic elastic member, so that the supporting block 11 easily follows the vibration of the vibration actuator 13, and the vibration can be more efficiently transmitted to the object to be vibrated.

The rigidity of the supporting block 11 is preferably lower than the rigidity of the vibration actuator 13. In this case, the supporting block 11 easily follows the vibration of the vibration actuator 13, and the vibration can be efficiently transmitted to the object to be vibrated.

The shape of the supporting block 11 may be a cubic shape according to certain embodiments, but not limited thereto.

According to a certain embodiment, the supporting block 11 comprises a channel 11d, two holes (FIG. 2, 3), and recesses 11e. According to certain embodiments, the supporting block 11 does not comprise the channel 11d.

According to a certain embodiment, the second part 12b of the vibration plate 12 is fixed to the upper surface 11a (first surface) of the supporting block 11 by fixing elements as described below.

According to a certain embodiment, the channel 11d is formed on the upper surface 11a of the supporting block 11, and extends from one side of the supporting block 11 to the other side of the supporting block 11, such that the channel 11d extends along with the first part 12a of the vibration plate 12 (FIG. 6). The width and depth of the channel 11d are designed such that the vibration actuator 13 is arranged in the channel 11d. The width and depth of the channel 11d is further designed such that, even when flexural vibration of the vibration actuator 13 is generated, the first part 12a and the vibration actuator 13 are not in contact with surface of the channel 11d. That is, even though the vibration actuator 13 is placed between the first part 12a of the vibration plate 12 and the supporting block 11, the vibration actuator 13 is not in contact with the supporting block 11.

Figure 8:
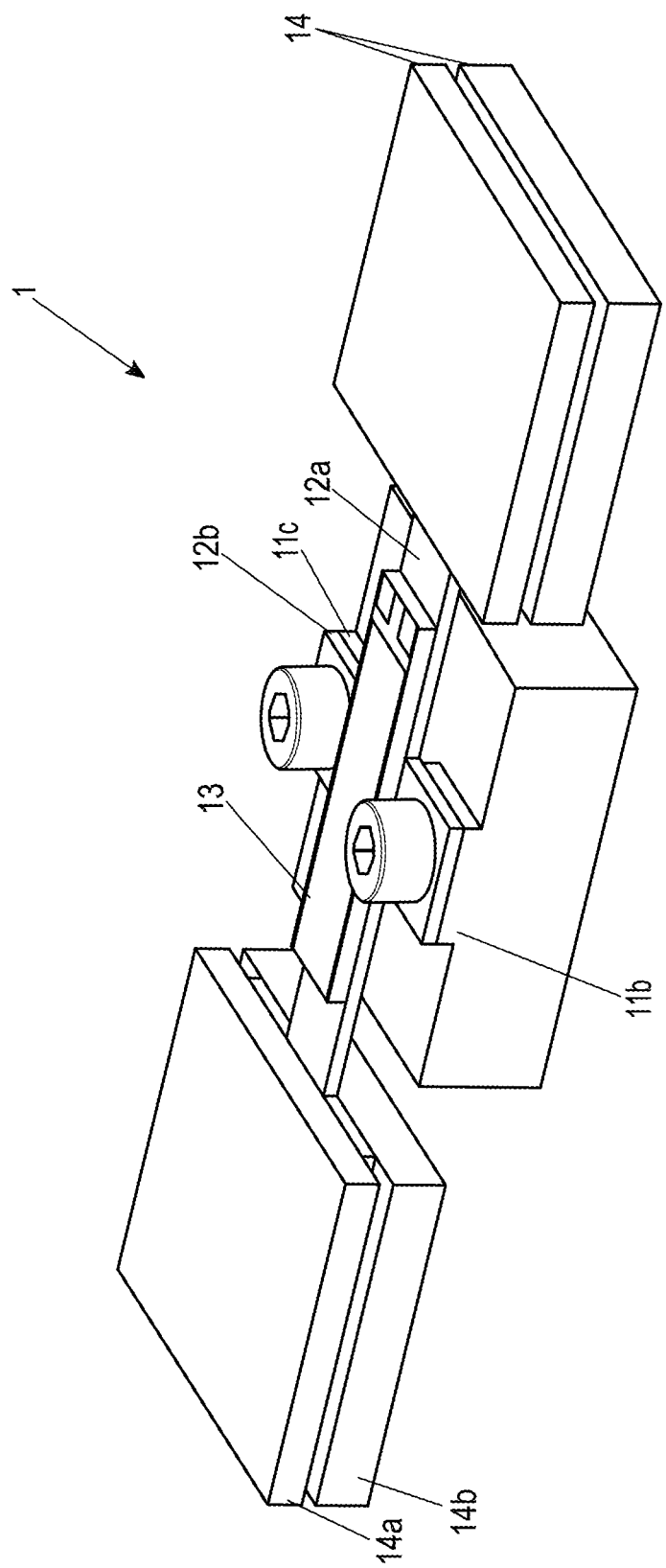
FIG. 8 is a perspective view illustrating a tactile vibration generator 1 according to a certain embodiment.

According to a certain embodiment, the two holes are formed on the upper surface 11a of the supporting block 11. The two holes of the supporting block 11 are opposing each other across the channel 11d. When the tactile vibration generator 1 is assembled, the two holes of the second part 12b of the vibration plate 12 are aligned with the two holes of the supporting block 11, respectively (FIG. 2). The fixing elements (e.g. screws 15a, 15b) are passed through the holes of the second part 12b and the holes of the supporting block 11, respectively, to fix the vibration plate 12 to the supporting block 11 (FIG. 1). According to certain embodiments, the two holes are formed on the protrusions 11b, 11c on the supporting block 11, respectively, as described below. Further, according to certain embodiments, the second part 12b of the vibration plate 12 is fixed to the protrusions 11b, 11c of the supporting block 11 by the fixing elements as described below (FIG. 8).

According to a certain embodiment, two recesses 11e can be formed at bottom-side surfaces of the supporting block 11, respectively. The bottom-side surfaces are the surfaces different from the upper surface 11a of the supporting block 11. Due to the recesses 11e, the supporting block 11 can easily follow the flexural vibration of the vibration actuator 13. According to certain embodiments, the two recesses 11e are not formed at the bottom-side surface of the supporting block 11.

According to a certain embodiment, the vibration plate 12 is fixed to the upper surface 11a of the supporting block 11 and functions as a member for amplifying the amplitude of vibration of the vibration actuator 13. The vibration plate 12 may have a long plate shape or a belt-like shape (FIG. 6). In this case, the flexural vibration of the vibration actuator 13 is followed and the amplitude of the vibration is easily amplified by the vibration plate 12. The vibration plate 12 may have a constant thickness along with the longitudinal direction. The rigidity of the vibration plate 12 is preferably lower than that of the vibration actuator 13, such that the vibration plate 12 easily follows the flexural vibration of the vibration actuator 13, and thus the vibration actuator 13 is not easily broken.

According to a certain embodiment, the vibration plate 12 has a first part 12a, and a second part 12b. As shown in FIG. 6, the second part 12b extends from both sides of the first part 12a, respectively, in a direction perpendicular to the longitudinal direction of the first part 12a. The vibration plate 12 is fixed to the supporting block 11 by fixing the second part 12b to the supporting block 11. The first part 12a is not in contact with the supporting block 11, and is the part to which the vibration actuator 13 is attached. Each of the first part 12a and second part 12b has an elongated shape, and the first part 12a and the second part 12b are at substantially right angles to each other. Since the vibration actuator 13 is attached only to the first part 12a, which is not in contact with the supporting block 11, it is possible for the vibration plate 12 to be vibrated effectively by the vibration actuator 13.

Further, according to a certain embodiment, the first part 12a and the second part 12b are at substantially right angles to each other preferably substantially at the middle of the first part 12a and the second part 12b, respectively. Therefore, it is possible to easily provide the vibration actuator 13 in the middle portion of the supporting block 11, when the tactile vibration generator 1 is assembled.

According to a certain embodiment, the length of the first part 12a in a longitudinal direction of the first part 12a is longer than the length of the second part 12b in the longitudinal direction of the second part 12b. Therefore, it is possible for the first part 12a vibrate more effectively.

According to a certain embodiment, as described above, the vibration plate 12 can be fixed to the supporting block 11 by using the screws 15a, 15b passing through the two holes of vibration plate 2 and the supporting block 11, respectively. Therefore, assembling of the tactile vibration generator 1 is simplified.

According to a certain embodiment, the vibration actuator 13 is attached to the lower surface (second surface) of the first part 12a of the vibration plate 12. That is, the vibration actuator 13 is arranged between the first part 12a of the vibration plate 12 and the supporting block 11. According to certain embodiments, the vibration actuator 13 is attached to the upper surface (first surface) of the first part 12a, such that the vibration actuator 13 and the supporting block 11 are arranged opposite sides of the first part 12a, as described below (FIG. 8, 11).

According to a certain embodiment, the vibration actuator 13 can be a piezoelectric element, an eccentric motor, a linear vibrator, a shape memory alloy or the like. The vibration actuator 13 can be composed of a piezoelectric body such as a ceramic piezoelectric body and a polymer piezoelectric body. The frequency of the vibration generated by the vibration actuator 13 can be about 30 Hz to 300 Hz, and the frequency may be about 150 Hz to 250 Hz as the tactile vibration for obtaining a good tactile sensation when a person touches an object to be vibrated such as a touch panel or a display panel with a finger or the like.

According to a certain embodiment, the vibration actuator 13 may have an elongated shape, and the vibration actuator 13 and the first part 12a extend in a same direction. In this configuration, the vibration actuator 13 can effectively vibrate the second part 12b.

According to a certain embodiment, the vibration actuator 13 may be attached to the lower surface of the first part 12a by an adhesive or the like (such as glue). Due to this configuration, the attachment of the vibration actuator 13 to the vibration plate 12 is simplified. According to certain embodiments, the vibration actuator 13 may be attached to the upper surface of the first part 12a by an adhesive or the like (such as glue).

According to a certain embodiment, the two screws 15a, 15b are arranged at opposite sides of the vibration actuator 13 when viewed from above the supporting block 11. Therefore, the vibration actuator 13 is less likely to break.

According to a certain embodiment, the first part 12a extends beyond two opposite sides of the supporting block 11 when viewed from above the supporting block 11. Two weights 14 are attached to both ends of the first part 12a respectively, such that the vibration actuator 13 can effectively vibrate the vibration plate 12. In detail, as shown in FIG. 7, the both ends of the first part 12a have larger surfaces when viewed from above the vibration plate 12, respectively. Therefore, the end of the first part 12a is ensured to support the weights 14 at both ends thereof.

According to a certain embodiment, the weight 14 comprises an upper plate weight (first plate weight) 14a and a lower plate weight (second plate weight) 14b, and the upper plate weight 14a and the second plate weight 14b sandwich the end of the first part 12a.

According to a certain embodiment, the thickness of the upper plate weight 14a may be different from the thickness of the lower plate weight 14b. In this configuration, the thickness of the weight 14 can be easily adjusted, and thus, the assembly space can be used in a more effective way.

According to a certain embodiment, the thickness of the lower plate weight 14b may be thicker than the thickness of the upper plate weight 14a. That is, the weight of the lower plate weight 14b may be heavier than the weight of the upper plate weight 14a. In this configuration, since the center of gravity of the vibration plate 12 including the weight 14 moves to the side of the support block 11, the vibration plate 12 stably vibrates. The thickness of the lower plate weight 14b may be more than 1 to 3 times the thickness of the upper plate weight 14a.

According to a certain embodiment, the weight of the lower plate weight 14b may be heavier than the weight of the upper plate weight 14a. That is, the specific gravity of the lower plate weight 14b may be greater than the specific gravity of the upper plate weight 14a. In this configuration, since the center of gravity of the vibration plate 12 including the weight 14 moves to the side of the support block 11, the vibration plate 12 stably vibrates. For example, a material of the upper plate weight 14a may be resin, and a material of the lower plate weight 14b may be metal. For example, materials of the upper plate weight 14a may be aluminum (Al), magnesium (Mg), and the like, and materials of the lower plate weight 14b may be tin (Sn), copper (Cu), iron (Fe), chromium (Cr), nickel (Ni), silver (Ag), and the like. In this case, the thickness of the lower plate weight 14b may be the same as the thickness of the upper plate weight 14a.

According to a certain embodiment, since the vibration actuator 13 is not in contact with the supporting block 11 even when the flexural vibration of the vibration actuator 13 is generated, the vibration actuator is not easily broken. Therefore, it is possible to extend the lifetime of the tactile vibration generator 1. Further, since it is possible to prevent the first part 12a and the vibration actuator 13 from contacting with the supporting block 11, it is also possible to avoid that the flexural vibration of the vibration actuator 13 is released to the supporting block 11. In addition, since the vibration actuator 13 is attached to the first part 12a only, which is not contact with the supporting block 11, the vibration actuator 13 can effectively vibrate the vibration plate 12.

Figure 9:
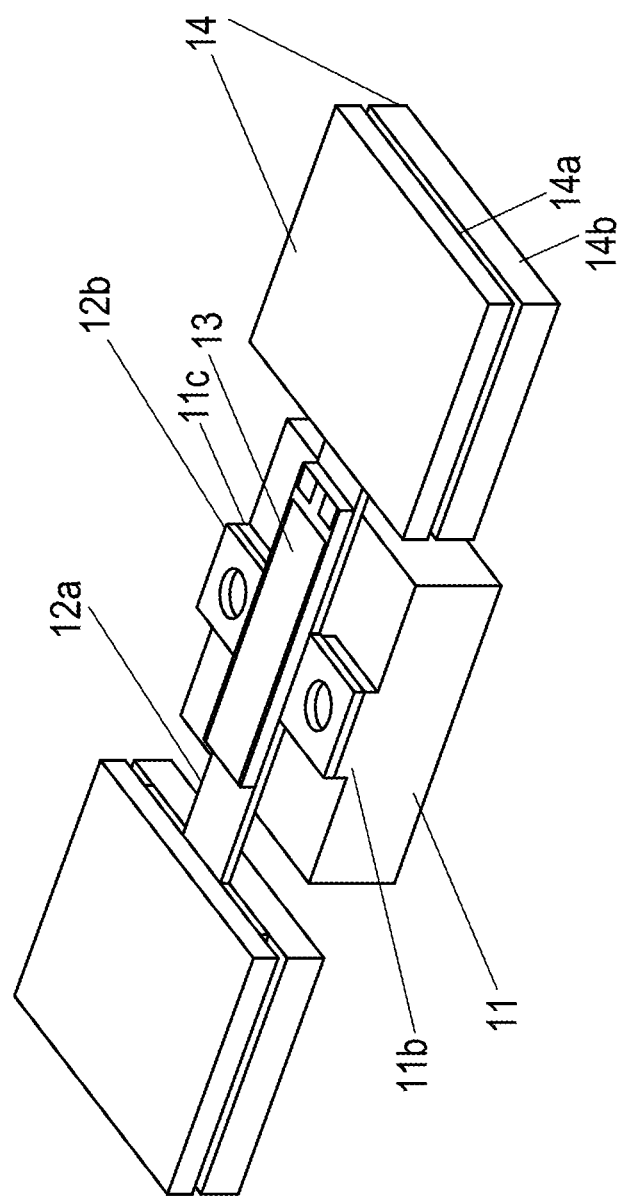
FIG. 9 is a perspective view illustrating a tactile vibration generator 1 without screws according to a certain embodiment.
Figure 10:
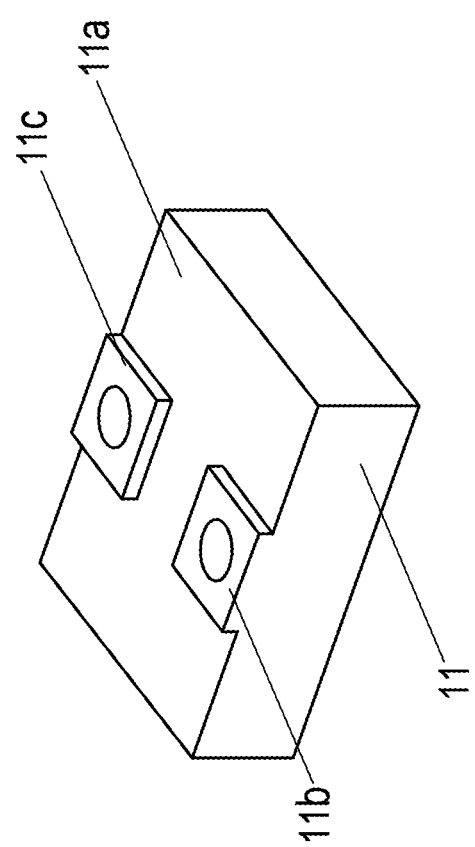
FIG. 10 is a perspective view illustrating a supporting block 11 of the tactile vibration generator 1 according to a certain embodiment.

FIG. 8 and FIG. 9 are perspective views illustrating a tactile vibration generator 1 according a certain embodiment. FIG. 8 shows a tactile vibration generator 1, and FIG. 9 shows a tactile vibration generator 1 without these screws. FIG. 10 shows a supporting block 11 of the tactile vibration generator 1 according to a certain embodiment.

The tactile vibration generator 1 according to a certain embodiment, the vibration actuator 13 is attached to the upper surface of the first part 12a.

According to a certain embodiment, the vibration actuator 13 may be directly attached to the upper surface (first surface) of the first part 12a of the vibration plate 12. In this configuration the vibration actuator 13 and the supporting block 11 are arranged at opposite sides of the first part 12a.

According to a certain embodiment, the supporting block 11 of the tactile vibration generator 1 has two protrusions 11b, 11c on the upper surface 11a of the supporting block 11 (FIG. 10). The two holes of the supporting block 11 are formed on the two protrusions 11b, 11c, respectively. When the tactile vibration generator 1 is assembled, the two holes of the second part 12b of the vibration plate are aligned with the two holes of the supporting block 11, respectively (FIG. 9). Then, the screws 15a, 15b are passed through the holes of the second part 12b and the holes of the supporting block 11, respectively, to fix the vibration plate 12 to the supporting block 11 (FIG. 8).

According to a certain embodiment, the vibration plate 12 is spaced away from the surface 11a of the supporting block 11 by means of the protrusions 11b, 11c. That is, the channel 11d according to certain embodiments is not required, and thus, a simplified tactile vibration generator 1 can be obtained.

According to a certain embodiment, the two protrusions 11b, 11c preferably have a height of at least 1 mm from the upper surface 11a of the supporting block 11, in order to allow the vibration actuator 13 to shrink and expand, and thus the first part 12a of the vibration plate 12 to vibrate without contact with the supporting block 11.

Thus, the lifetime of the tactile vibration generator 1 according to a certain embodiment can also be extended with a simplified configuration.

Figure 11:
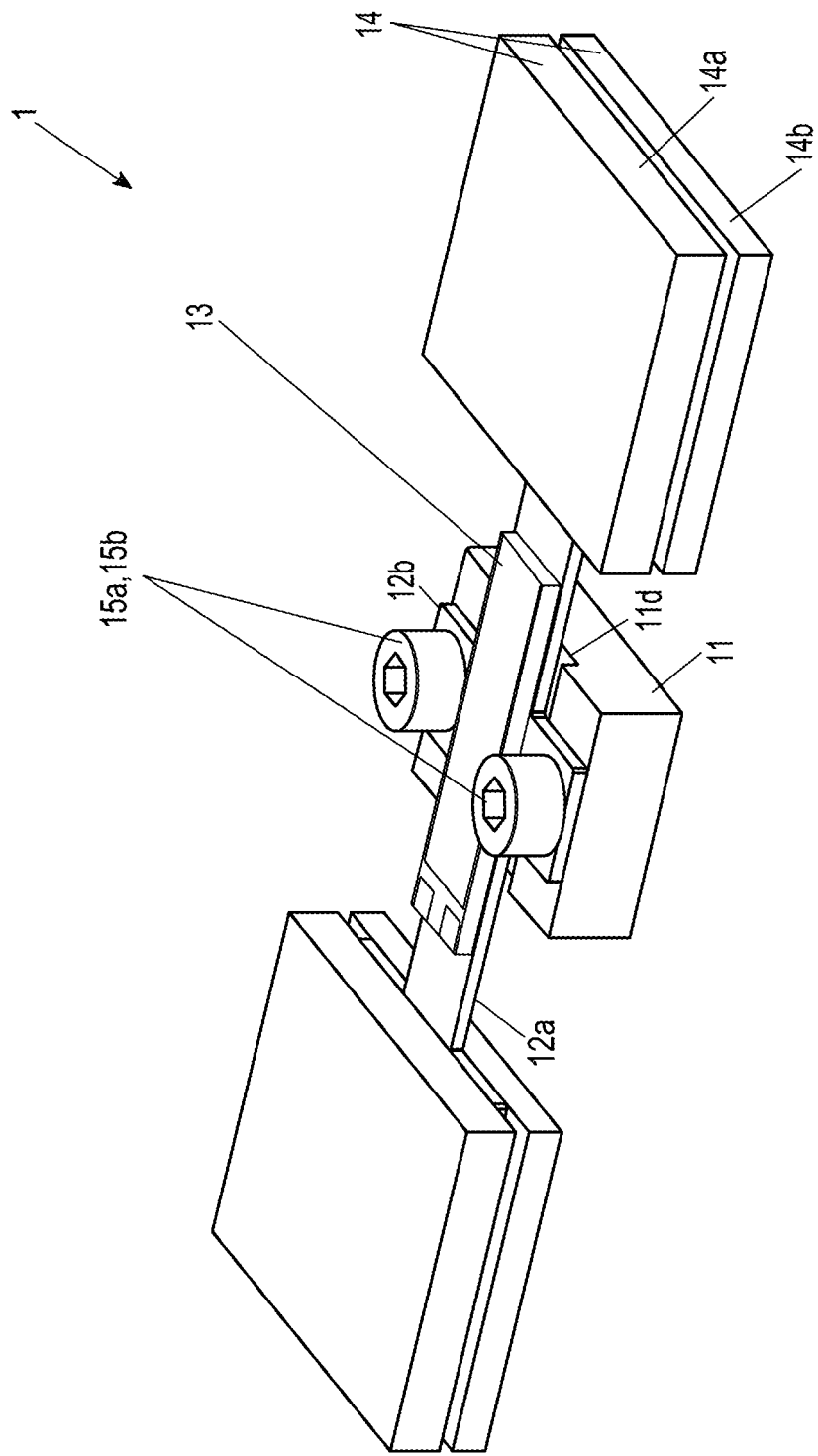
FIG. 11 is a perspective view illustrating a tactile vibration generator 1 according to a certain embodiment.
Figure 12:
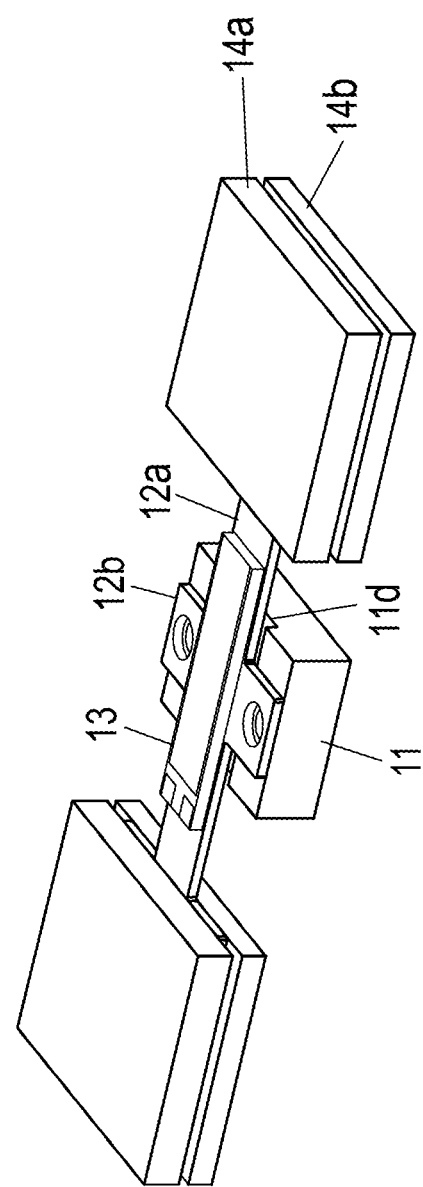
FIG. 12 is a perspective view illustrating a tactile vibration generator 1 without screws according to a certain embodiment.
Figure 13:
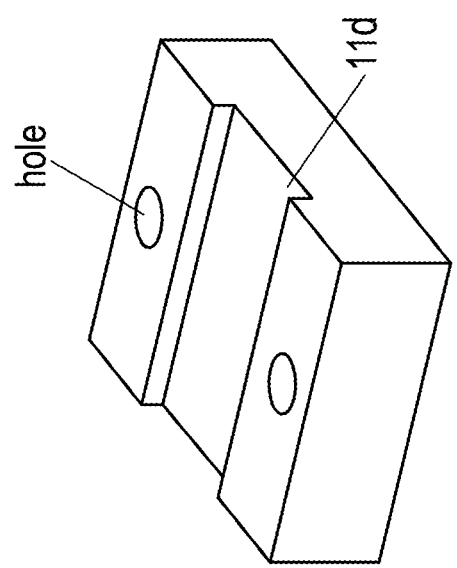
FIG. 13 is a perspective view illustrating a supporting block 11 of the tactile vibration generator 1 according to a certain embodiment.

FIG. 11 and FIG. 12 are perspective views illustrating a tactile vibration generator 1 according to a certain embodiment. FIG. 11 shows a tactile vibration generator 1, and FIG. 12 shows a tactile vibration generator 1 without these screws. FIG. 13 shows a supporting block 11 of the tactile vibration generator 1 according to a certain embodiment.

According to a certain embodiment, the supporting block 11 comprises the channel 11d, and does not have the protrusions on the surface 11a of the supporting block 11 (FIG. 13). Further, the vibration actuator 13 is attached to the upper surface of the first part 12a.

When the tactile vibration generator 1 is assembled, the two holes of the second part 12b of the vibration plate 12 are aligned with the two holes of the supporting block 11, respectively (FIG. 12). The fixing elements are passed through the holes of the second part 12b and the holes of the supporting block 11, respectively, to fix the vibration plate 12 to the supporting block 11 (FIG. 11).

According to a certain embodiment, the first part 12a of the vibration plate 12 is spaced away from the supporting block 11 by the channel 11d such that the first part 12a is not in contract with the supporting block 11. In addition, since the vibration actuator 13 is attached to the upper surface of the first part 12a, the vibration actuator 13 is not in contact with the supporting block 11, either. Therefore, the lifetime of the tactile vibration generator 1 is extended by more simplified configuration.

MODIFIED CERTAIN EMBODIMENTS

Vibration Actuator 13

The vibration actuator 13 can be a piezoelectric element. As the material of the ceramic piezoelectric body of the piezoelectric element 13, barium titanate ($BaTiO_3$), lead titanate ($PbTiO_3$), lead zirconate titanate (Pb [$Zr_xTi_{1-x}$] $O_3$ $0<x<1$ mixed crystal: PZT), potassium niobate ($KNbO_3$), lithium niobate ($LiNbO_3$), lithium tantalate ($LiTaO_3$), sodium tungstate ($Na_xWO_3$), zinc oxide (ZnO, $Zn2O_3$), $Ba_2NaNb_5O_5$, $Pb_2KNb_5O_{15}$, lithium tetraborate ($Li_2B_4O_7$), sodium potassium niobate ((K, Na) $NbO_3$), sodium bismuth titanate ($Na_{0.5}$ $Bi_{0.5}$ $TiO_3$), or the like can be used. As the material of the polymer piezoelectric body, polyvinylidene fluoride (1,1-2 fluoroethane polymer: PVDF) or the like can be adopted.

The amplitude of the vibration of the piezoelectric element 13 is typically about 30 μm to 1000 μm, and the amplitude may be about 50 μm to 150 μm as a tactile vibration generator 1 for obtaining a good tactile sensation with a human finger.

As described above, the tactile vibration generator 1 is installed on a body to be vibrated such as a touch panel and a display panel. Specifically, it is installed on a substrate such as a glass substrate constituting a touch panel or a display panel, or a frame body or a case attached to the peripheral edge of the substrate. When the tactile vibration generator 1 is installed on a substrate, if the substrate is a polygonal substrate such as a square, the tactile vibration generator 1 may be installed at a position of the substrate where the vibration of the piezoelectric element 13 transmitted to the substrate is reflected by and interferes with the opposing sides of the substrate, and natural vibration (resonant vibration) is likely to occur. That is, a tactile vibration generator 1 may be provided at the center of one side of the substrate.

Further, the vibration generated on the substrate includes a lateral vibration having an amplitude in a direction perpendicular to the surface of the substrate and a longitudinal vibration having an amplitude in a direction parallel to the surface of the substrate. However, it is desirable to efficiently generate the lateral vibration at the point of efficiently generating the natural vibration. For this purpose, it is desirable to install a tactile vibration generator 1 on the surface of the substrate at the center of one side of the substrate. When a tactile vibration generator 1 is provided on a frame, a case, or the like, it is desirable to provide the tactile vibration generator 1 on a surface of the substrate corresponding to a central portion of one side of the substrate.

Further, a tactile vibration generator 1 may be provided at the center of the surface of the substrate or at a portion of the case corresponding to the center. In this case, even if the shape of the substrate has various shapes such as a triangular shape, a square shape, a polygonal shape having a pentagon or more, a circular shape, etc., vibration of the tactile vibration generator 1 is reflected and interfered at every part of the substrate facing each other, and the natural vibration is easily generated.

Specifically, the following configuration may be used. When the substrate is rectangular, if the tactile vibration generator 1 is installed on one side (the length is represented as "Ls") of the substrate, it is desirable to install the tactile vibration generator 1 at a position of Ls/2, Ls/3, Ls/4, . . . , Ls/n (n is an integer number greater than or equal to 2) from the end of the side. In this case, since the portion Ls/n from the end of the side portion is the antinode of the natural vibration, the natural vibration can be efficiently generated.

The line segment connecting the point p1 at the side of the rectangular substrate and the point p2 at the position opposed to the point p1 at the side of the substrate, and passing through the center of the surface of the substrate is referred to as "lp", and the length of the line segment lp is referred to as "Lp". The tactile vibration generator 1 may be disposed on the line segment lp at positions Lp/2, Lp/3, Lp/4, . . . Lp/n from the point p1 or the point p2. In this case, since the point p1 or the point p2 to Ls/n on the line segment lp is the antinode of the natural vibration, the natural vibration can be efficiently generated. More preferably, the point p1 is the center point of one side part, and the point p2 is the center point of the opposite side part.

The shape of the piezoelectric element 13 may be a columnar body such as a rectangular parallelepiped, a cube, a plate-like body, or a columnar body, but a plate-like body having a longitudinal direction such as a long plate or a belt-like body is preferable. In this case, it is suitable for the purpose of generating vibration in which both ends or central portions of the piezoelectric element 13 largely vibrate in a direction perpendicular to the longitudinal direction (i.e. direction orthogonal to the principal surface of the piezoelectric element 13). This vibration is a so-called "flexural vibration".

Vibration Plate 12

The vibration plate 12 is a diaphragm, and thus the material of the vibration plate 12 may be a material suitable for the purpose of largely amplifying the amplitude of vibration of the piezoelectric element 13. For example, a metal having toughness, an alloy, a resin having elasticity, or the like can be used. Metals include aluminum (Al), titanium (Ti), beryllium (Be), magnesium (Mg) (Particularly, high-purity magnesium containing chemically stable Mg in a mass % of ≥99.95%), zinc (Zn), tin (Sn), copper (Cu), iron (Fe), chromium (Cr), nickel (Ni), silver (Ag), and the like. In particular, aluminum (Al), beryllium (Be), and magnesium (Mg) (especially high-purity magnesium) are desirable, because they are light metals with high rigidity and whose inertial mass can be reduced so as to easily follow the vibration of the vibration actuator 13.

Examples of the alloy include duralumin (Al—Cu alloy, Al—Cu—Mg alloy, Al—Zn—Mg—Cu alloy) mainly composed of aluminum, magnesium alloy (Mg—Al alloy, Mg—Zn alloy, Mg—Al—Zn alloy) mainly composed of magnesium, titanium boron, stainless steel, and Cu—Zn alloy. In particular, a duralumin or magnesium alloy is desirable because it is an alloy capable of reducing the inertial mass so as to easily follow the vibration of the vibration actuator 13 and has high rigidity.

More examples of the alloy include titanium alloy (Ti—Al—Sn alloy, Ti—Al—V alloy, Ti—Al—V—Sn alloy, Ti—Al—V—Cr—Mo—Zr alloy, Ti—Al—Mo—V alloy, Ti—V—Cr—Al alloy, Ti—Pd alloy) mainly composed of titanium. These titanium alloys have lightweight, high strength, and excellent corrosion resistance. These titanium alloys are capable of reducing the inertial mass so as to easily follow the vibration of the vibration actuator 13 and has high rigidity. And the durability of the vibration plate 12 is improved, and as a result, the life of the tactile vibration generator 1 is prolonged.

Examples of the resin include polypropylene, polyethylene terephthalate (PET), polyetherimide, polyethylene naphthalate, and polyphenylene terephthalamide. Further, a composite resin having high durability in which carbon fiber is mixed into these resins may be used.

The vibration plate 12 (first part 12*a* and/or the second part 12*b*) may have a rectangular shape having a constant length in the short direction (perpendicular to the longitudinal direction), but may have a shape in which each length in the short direction of both ends of the vibration plate 12 is shorter than the length in the short direction of the center of the vibration plate 12. Further, the vibration plate 12 may have a shape in which the length of the vibration plate 12 in the short direction gradually decreases from the central portion toward both end portions. In these cases, since the inertial mass at both ends of the vibration plate 12 is reduced, the vibration follows the flexural vibration of the vibration actuator 13, and the amplitude of the vibration is more easily amplified. Further, as a shape suitable for reducing the inertial mass of both ends of the vibration plate 12, each thickness of both ends of the vibration plate 12 may be thinner than the thickness of the central part of the vibration plate 12.

Supporting Block 11

Materials of the supporting block 11 include metals such as aluminum, magnesium (Mg) (especially high-purity magnesium), zinc (Zn), tin (Sn), copper (Cu), iron (Fe), chromium (Cr), and nickel (Ni), alloys such as duralumin (Al—Cu alloy, Al—Cu—Mg alloy, Al—Zn—Mg—Cu alloy), magnesium alloys (Mg—Al alloy, Mg—Zn alloy, Mg—Al—Zn alloy), stainless steel, Cu—Zn alloys, and resins such as acrylic resins, epoxy resins, polycarbonates, Teflon(®) resins (polytetrafluoroethylene), and silicone resins.

More materials of the supporting block 11 include aforesaid the titanium alloys. Therefore the durability of the supporting block 11 is improved, and as a result, the life of the tactile vibration generator 1 is prolonged.

In order for the supporting block 11 to follow the vibration of the vibration actuator 13, and to transmit the vibration more efficiently to the object to be vibrated, resins such as acrylic resin, epoxy resin, polycarbonate, Teflon(®) resins (polytetrafluoroethylene), silicone resin, and the like are preferable for the supporting block 11.

The proportion of the fine space portion in the supporting block 11 may be about 1 to 50 vol. %. For the same purpose, instead of many fine spaces, many fine particles made of a flexible resin such as silicone resin may be mixed into the supporting block 11. The proportion of the fine particles in the supporting block 11 may be about 1 vol. % to about 50 vol. %.

As described above, the supporting block 11 may be in contact with the vibrated body, or may be bonded via an adhesive layer. The adhesive layer preferably has a higher rigidity than the supporting block 11. In this case, vibration can be efficiently transmitted to an object to be vibrated comprising a rigid body such as a glass substrate via an adhesive layer. The supporting block 11 may be fixed by a fixing member such as a screw to a frame disposed on the peripheral edge of a vibrating object such as a touch panel or a display panel.

The size of the supporting block 11 may include the entire vibration actuator 13 when viewed from above of the tactile vibration generator 1 (in plan view). In this case, the supporting block 11 can efficiently receive the vibration of the vibration actuator 13, and can suppress a violent vibration of the vibration actuator 13 to suppress breakage of the piezoelectric element 13 such as a crack.

The basic shape of the supporting block 11 may be a rectangular parallelepiped shape, a cylindrical shape, a partial quadrangular pyramid shape, a partial cone shape, or the like.

As shown in FIGS. 14A to 14E, the supporting block 11 may have a recess 11e or a groove 11f on the surface on the side of the vibrated body 3. In this case, the supporting block 11 easily follows the flexural vibration of the piezoelectric element 13, and the flexural vibration can be efficiently transmitted to the vibrated body 3.

Figure 14A:
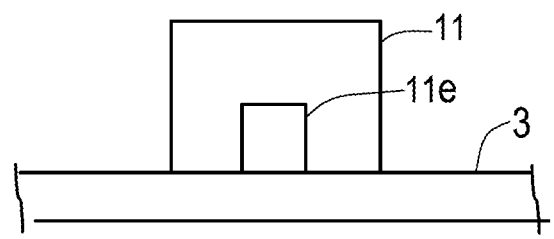
FIG. 14A is a side view of the blocking element 11 with recess 11e arranged on the substrate 3 according to a modified certain embodiment.
Figure 14B:
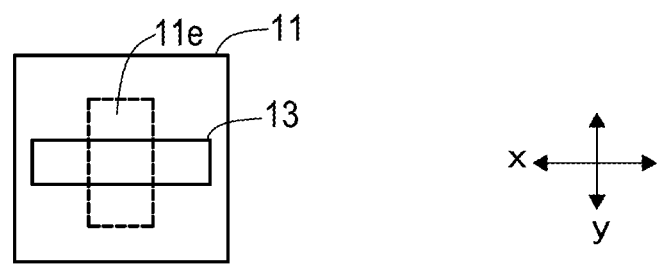
FIGS. 14B to 14E are top views of the blocking element 11 with recess 11e and grooves 11f, respectively, according to the modified certain embodiment.

FIG. 14B shows a configuration in which one recess 11e is located on the bottom surface of the supporting block 11 on the side of the vibrating object 3. Further, the recess 11e has a shape extending in the transverse direction (y direction) orthogonal to the longitudinal direction (x direction) of the piezoelectric element 13 when viewed from above of the supporting block 11. In this case, the supporting block 11 easily follows the flexural vibration of the vibration actuator 13 in the x direction, and the flexural vibration can be efficiently transmitted to the vibrated body 3.

Figure 14C:
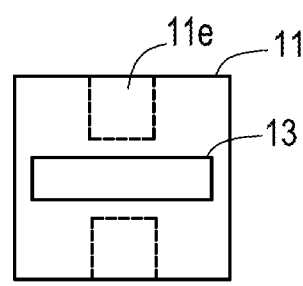

FIG. 14C shows a configuration in which a plurality of recesses 11e are arranged in the y direction. Also in this case, the supporting block 11 easily follows the flexural vibration, and the flexural vibration can be efficiently transmitted to the vibrated body 3.

Figure 14D:
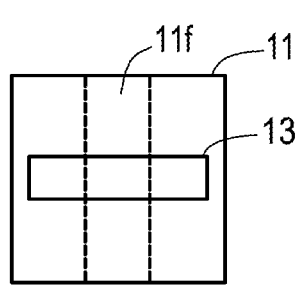

FIG. 14D shows a configuration in which one groove 11h extending in the y-direction is arranged. In this case, the supporting block 11 can easily follow the flexural vibration of the vibration actuator 13, and the flexural vibration can be transmitted to the vibrated body 3 more efficiently.

Figure 14E:
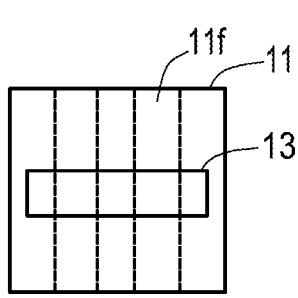

FIG. 14E shows a configuration in which a plurality of grooves 11f extending in the y-direction are arranged. In this case, the supporting block 11 can easily follow the flexural vibration of the vibration actuator 13, and the flexural vibration can be transmitted to the vibrated body 3 more efficiently.

Figure 15A:
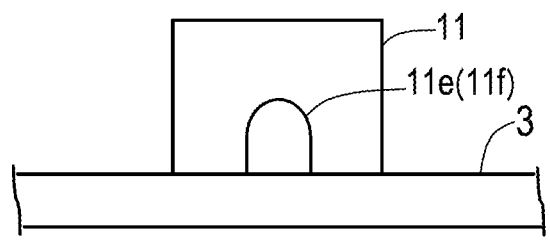
FIGS. 15 A and 15B are side views of the blocking element 11 with recess 11e and groove 11f arranged on the substrate 3, respectively, according to the modified certain embodiment.
Figure 15B:
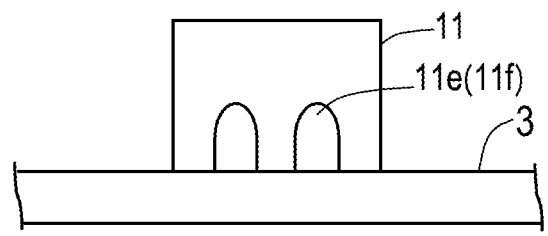

As shown in FIGS. 15A and 15B, the recess 11e or the groove 11f may have a curved bottom surface close to the vibration actuator 13 (not shown in these figures). In this case, the supporting block 11 can easily follow the flexural vibration of the vibration actuator 13, and the flexural vibration can be transmitted to the vibrated body 3 more efficiently.

Weight 14

FIGS. 16A to 22D show various embodiments of a tactile vibration generator 1 with different weights, respectively.

Figure 16A:
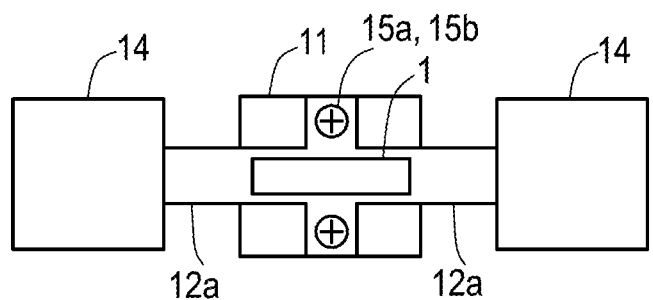
FIG. 16A is a top view of the tactile vibration generator 1 including the weights 14 according to the modified certain embodiment.

FIGS. 16A to 16F are plan views of a tactile vibration generator 1. FIG. 16A shows a configuration in which the weights (inertial mass increasing portion) 14 are provided at both ends of the first part 12a of the vibration plate 12, respectively. The two fixing parts (screws) 15a, 15b extending in a direction orthogonal to the longitudinal direction of the vibration plate 12 are provided in the central part of the vibration plate 12. The head of the screw 15a, 15b is preferably a flat surface, and the head of the screw 15a, 15b is more preferably a low head screw (also called a sunken head screw) which does not protrude from the upper surface of the second part 12b of the vibration plate 12 when they are screwed. In the case of a high head screw, the head part is in a state of protruding from the upper surface of the vibration plate 12 when the screw is inserted, and the head part tends to reflect and scatter the vibration of the vibration actuator 13 and disturb the waveform of the vibration.

Further, it is desirable that the center (central axis) of the screw 15a, 15b is positioned closer to the outer end than the position of ½ of the length of the second part 12b in the y direction. In this case, since the fixing portion by the screw 15a, 15b moves away from the vibration actuator 13, it is possible to suppress the vibration of the vibration actuator 13 from being attenuated by the second part 12b.

The weight 14 may be integrated with the vibration plate 12 or may be separate from the vibration plate 12. The material of the weight 14 may be the same as or different from the vibration plate 12.

The weight 14 has a width in y direction larger than that of the first part 12a and the mass per unit length (for example, 1 mm.) of the weight 14. In the configuration shown in FIG. 16A, the weights 14 are plate-like bodies having square or rectangular shapes when viewed from the above of the tactile vibration generator 1 (in plan view). The weights 14 may be integral with the first part 12a, or may be separate bodies such as in the above described according to certain embodiments. When the weights 14 are integrated with the first part 12a, the entire vibration plate 12 can be manufactured by a machining method such as a cutting method, a press molding method, an injection molding method, etc. When the weights 14 are separate from the first part 12a, the weights 14 can be fixed to the first part 12a by a fixing method such as bonding or screwing.

Figure 16B:
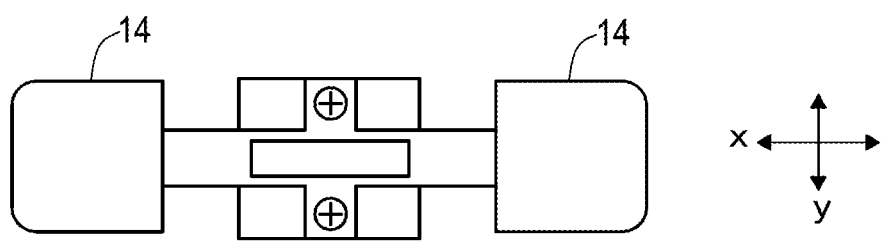
FIGS. 16B to 16F are top views of the tactile vibration generator 1 including the weights 14 with rounded corner, respectively, according to the modified certain embodiment.

FIG. 16B shows a configuration in which the outer corner portions of the weight 14 are rounded into a curved shape. In this case, when the vibration plate 12 vibrates, the air resistance of the portion outside weight 14 having the largest amplitude decreases, and the vibration of the vibration plate 12 easily shifts from the rising state to the steady state. The rising state is a state in which the vibration plate 12 shifts from low frequency vibration to higher-frequency tactile vibration due to its inertial mass. The steady state is a state in which the vibration has a constant frequency (resonant frequency) equal to the natural frequency of the object to be vibrated.

Figure 16C:
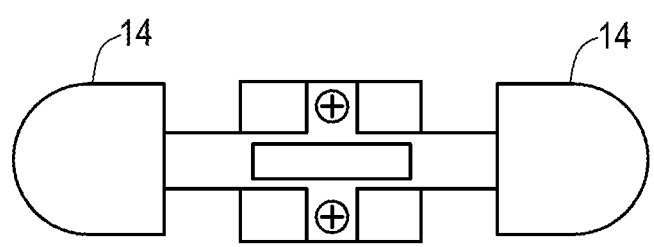

FIG. 16C shows a configuration in which the outer corner portions and the side portions of the weights 14 are rounded into a curved shape such as an arc shape. In this case, when the vibration plate 12 vibrates, the air resistance of the portion outside the weights 14 having the largest amplitude is further reduced, and the vibration of the vibration plate 12 is easily shifted from the rising state to the steady state.

Figure 16D:
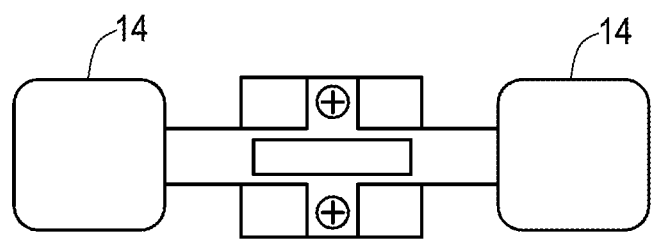

FIG. 16D shows a configuration in which the outer corner portions of the weights 14 and the inner corner portions of the weights 14 are rounded into a curved shape such as an arc shape. In this case, the air resistance of the outer portion and the inner portion of the weights having the largest amplitude when the vibration plate 12 vibrates decreases, and the vibration of the vibration plate 12 shifts from a rising state to a steady state.

Figure 16E:
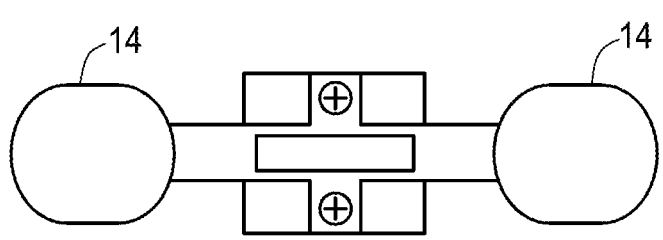

FIG. 16E shows a configuration in which the outer corner and side portions of the weights 14 and the inner corner and side portions of the weights 14 are rounded into a curved shape such as an arc shape. In this case, the air resistance of the outer portion and the inner portion of the weights 14 having the largest amplitude when the vibration plate 12 vibrates decreases, and the vibration of the vibration plate 12 easily shifts from a rising state to a steady state.

Figure 16F:
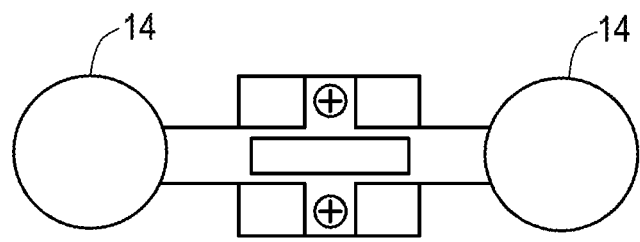

FIG. 16F shows a configuration in which the weights 14 are rounded in a circular or elliptical shape as a whole. In this case, when the vibration plate 12 vibrates, the overall air resistance of the weights 14 decreases, and the vibration of the vibration plate 12 easily shifts from a rising state to a steady state.

Figure 17A:
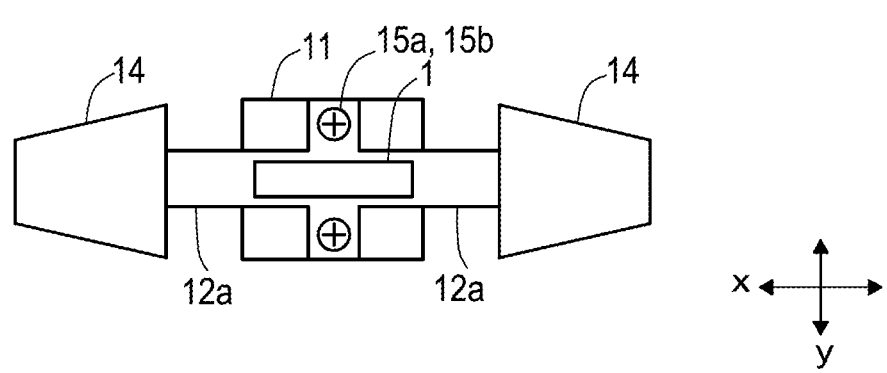
FIGS. 17A and 17B are top views of the tactile vibration generator 1 including the weights 14 with a trapezoidal and triangular shape, respectively, according to the modified certain embodiment.
Figure 17B:
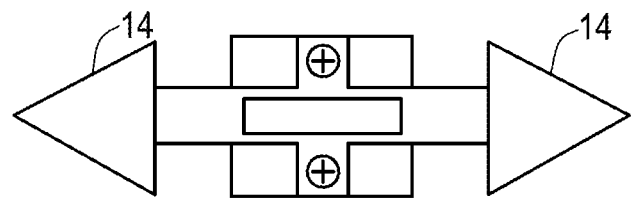

FIGS. 17A and 17B are top views of other embodiments of the tactile vibration generator 1. As shown in these drawings, the weights 14 may have a shape in which the width (y direction) of the outer end is smaller than the width of the inner end. In this case, when the vibration plate 12 vibrates, the inertia and air resistance of the outer parts of the weights 14 having the largest amplitude decrease, and the vibration of the vibration plate 12 is easily shifted from the rising state to the steady state.

FIGS. 18A to 18F are side views of other embodiments of a tactile vibration generator 1. As shown in these drawings, the principal surfaces of the weights 14 (largest surface of the weight 14) may be parallel to the vibration plane including the vibration direction. In this case, when the vibration plate 12 vibrates, the overall air resistance of the weights 14 is further reduced, and the vibration of the vibration plate 12 easily shifts from a rising state to a steady state.

Figure 18A:
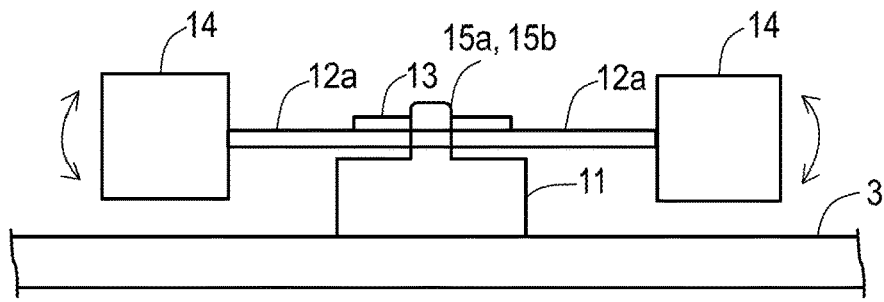
FIG. 18A is a side view of the tactile vibration generator 1 including the weights 14 of plate-like bodies having a square shape according to the modified certain embodiment.

FIG. 18A shows a configuration in which the weights 14 are platelike bodies having a square shape, such as a square shape or a rectangle shape in a front view.

Figure 18B:
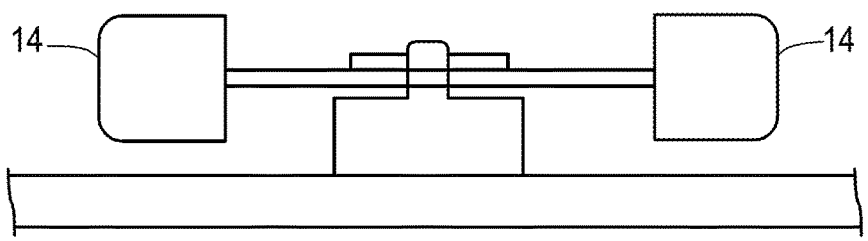
FIGS. 18B to 18F are side views of the tactile vibration generator 1 including the weights 14 of plate-like bodies having rounded corners, respectively, according to the modified certain embodiment.

FIG. 18B shows a configuration in which the outer corner portions of weights 14 are rounded into a curved shape such as an arc shape. In this case, when the vibration plate 12 vibrates, the air resistance of the portion outside the weights 14 having the largest amplitude is further reduced, and the vibration of the vibration plate 12 is easily shifted from the rising state to the steady state.

Figure 18C:
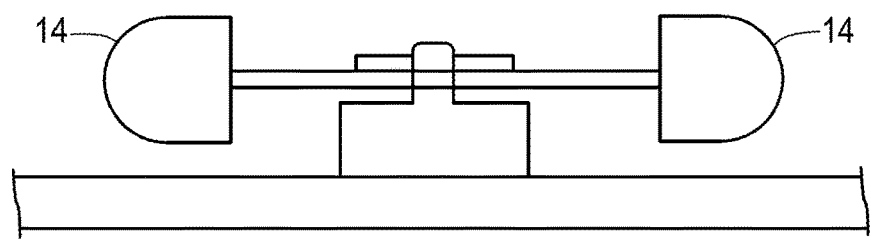

FIG. 18C shows a configuration in which the corners and sides of the outer portions of the weights 14 are rounded into a curved shape such as an arc shape. In this case, when the vibration plate 12 vibrates, the air resistance of the portion outside the weights 14 having the largest amplitude is further reduced, and the vibration of the vibration plate 12 is easily shifted from the rising state to the steady state.

Figure 18D:
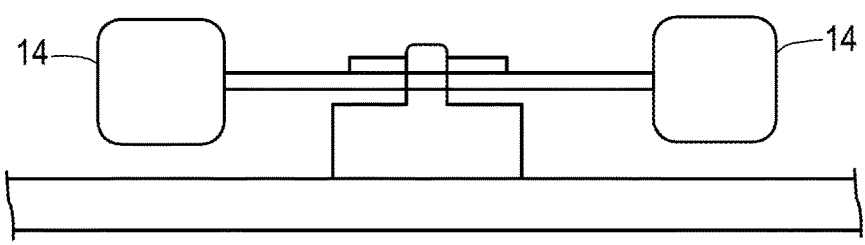

FIG. 18D shows a configuration in which the outer corner portions of the weights 14 and the inner corner portions of the weights 14 are rounded into a curved shape such as an arc shape. In this case, the air resistance of the outer portion and the inner portion of the weights 14 having the largest amplitude when the vibration plate 12 vibrates decreases, and the vibration of the vibration plate 12 easily shifts from a rising state to a steady state.

Figure 18E:
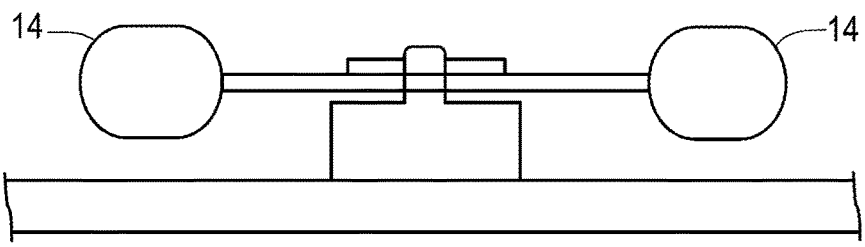

FIG. 18E shows a configuration in which the outer corner and side portions of the weights 14 and the inner corner and side portions of the weights 14 are rounded into a curved shape such as an arc shape. In this case, the air resistance of the outer part and the inner part of the weights 14 having the largest amplitude when the vibration plate 12 vibrates is further reduced, and the vibration of the vibration plate 12 easily shifts from a rising state to a steady state.

Figure 18F:
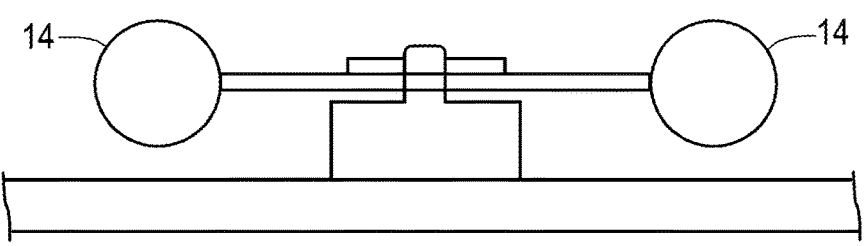

FIG. 18F shows a configuration in which the weights 14 are rounded in a circular or elliptical shape as a whole. In this case, when the vibration plate 12 vibrates, the overall air resistance of the weights 14 decreases, and the vibration of the vibration plate 12 easily shifts from a rising state to a steady state.

Figure 19A:
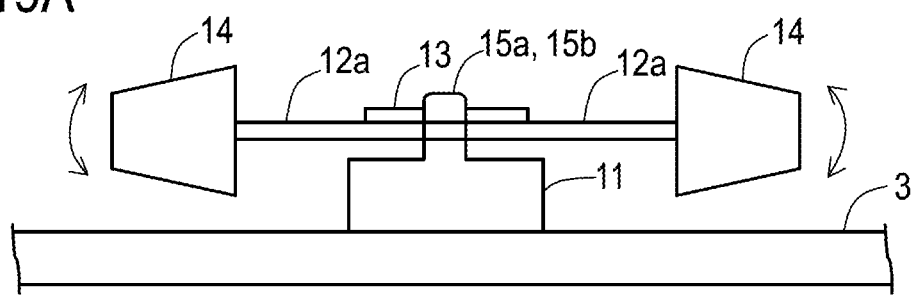
FIGS. 19A and 19B are side views of the tactile vibration generator 1 including the weights 14 of plate-like bodies having a trapezoidal and triangle shape, respectively, according to the modified certain embodiment.
Figure 19B:
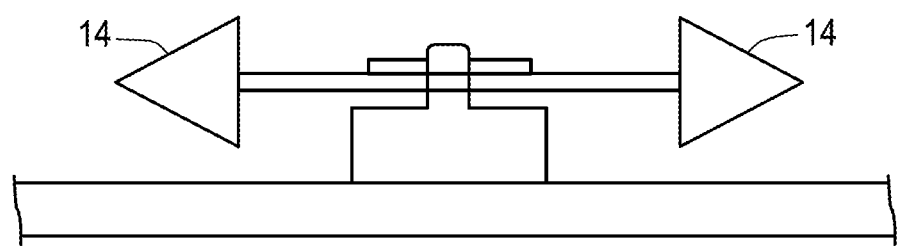
Figure 20A:
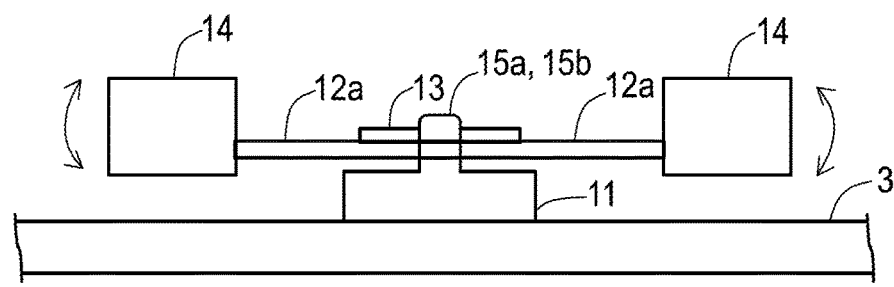
FIGS. 20A to 20F are the side views of the tactile vibration generator 1 arranged on the substrate 3 including the weights 14 having their center of gravity positioned above the vibration plate 12, respectively, according to the modified certain embodiment.
Figure 20B:
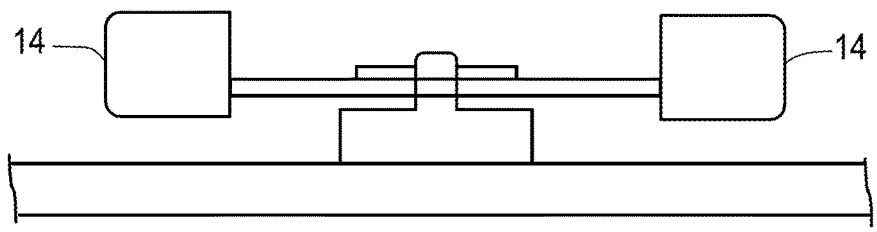
Figure 20C:
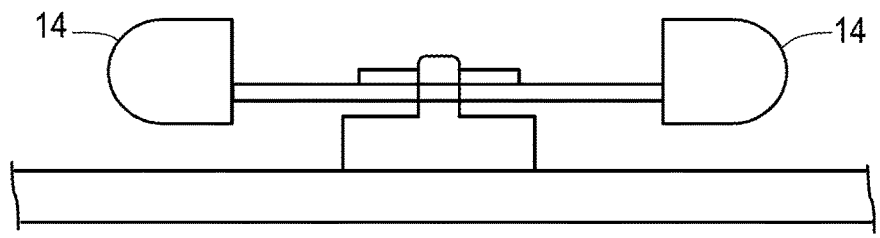
Figure 20D:
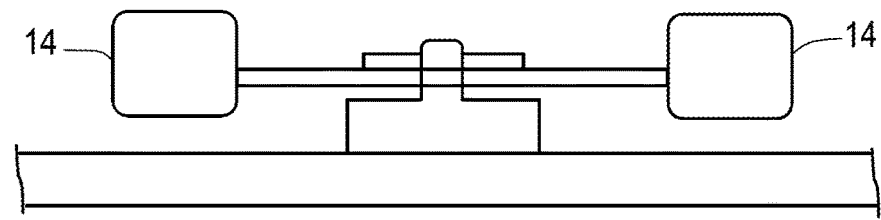
Figure 20E:
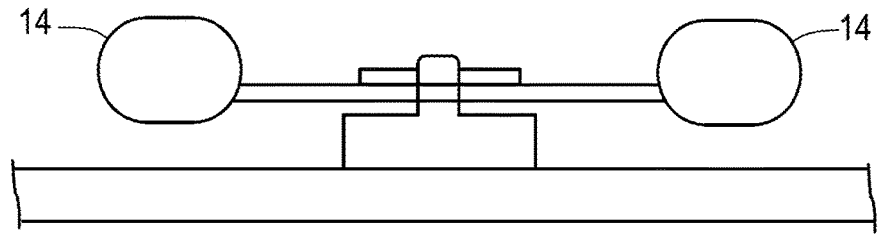
Figure 20F:
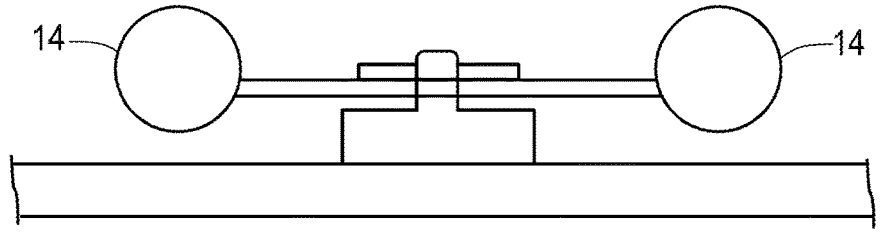

FIGS. 19A and 19B are side views of other embodiments of the tactile vibration generator 1. As shown in these drawings, the weights 14 may have a shape in which the width (in direction perpendicular to x, y directions) of the outer end of the main surface is smaller than the width of the inner end. In this case, when the vibration plate 12 vibrates, the inertia of the outer parts of the weights 14 having the largest amplitude decreases, and the vibration of the vibration plate 12 easily shifts from a rising state to a steady state.

As shown in FIG. 19A, the weights 14 may have a trapezoidal shape, and as shown in FIG. 19B, the weights 14 may have a triangular shape when viewed in y direction. In these cases, the inertia of the outer portions of weights 14 having the largest amplitude when the vibration plate 12 vibrates is further reduced, and the vibration of the vibration plate 12 is easily shifted from the rising state to the steady state.

FIGS. 20A to 20F are side views of other embodiments of a tactile vibration generator 1. As shown in these drawings, the weights 14 may have their center of gravity positioned above the vibration plate 12. In this case, when the weights 14 vibrate, the weights 14 can be prevented from contacting or colliding with the substrate 3. The tactile vibration generator 1 can be miniaturized. FIGS. 20A to 20F correspond to FIGS. 18A to 18F, respectively, and a detailed description thereof is omitted.

Figure 21A:
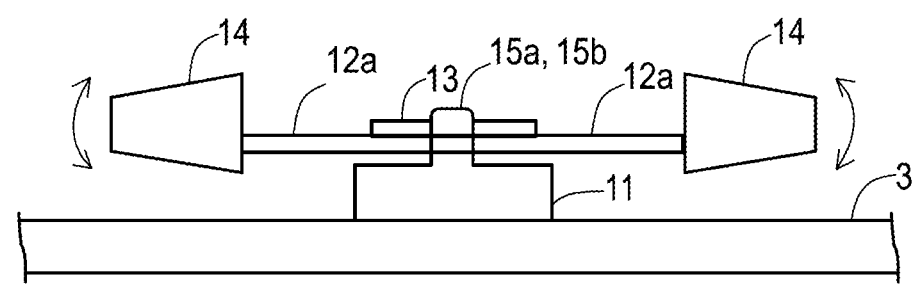
FIGS. 21A and 21B are side views of the tactile vibration generator 1 including the weights 14 having their center of gravity positioned above the vibration plate 12, respectively, according to the modified certain embodiment.
Figure 21B:
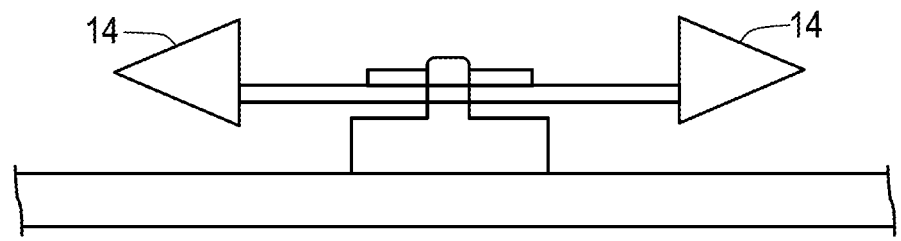

FIGS. 21A and 21B are side views of another embodiment of the tactile vibration generator 1. As shown in these drawings, the weights 14 may have a shape in which the position of the center of gravity thereof is located above the vibration plate 12, and the width of the outer end of the main surface of the weights 14 is smaller than the width of the inner end (in direction perpendicular to x, y directions). In this case, when the weights 14 vibrate, the weights 14 can be prevented from coming into contact with or colliding with the substrate 3, the tactile vibration generator 1 can be miniaturized, the inertia of the part outside the weights 14 having the largest amplitude when the vibration plate 12 vibrates is further reduced, and the vibration of the vibration plate 12 is easily shifted from a rising state to a steady state.

As shown in FIG. 21A, the weights 14 may have trapezoidal shape, and as shown in FIG. 21B, the weights 14 may have triangular shape in viewed in y direction. In these cases, the inertia of the outer portions of the weights 14 having the largest amplitude when the vibration plate 12 vibrates is further reduced, and the vibration of the vibration plate 12 is easily shifted from the rising state to the steady state.

FIGS. 16A to 21B show the case where the weights 14 are plate-like bodies, but the weights 14 may be prismatic bodies such as a rectangular column or a cylindrical column. In this case, at least part of the outer portions of the weights 14 may be rounded into a curved shape.

FIGS. 22A to 22D are top views of other embodiments of a tactile vibration generator 1. As shown in these drawings, the weight 14 may have at least one through hole 14c. In this case, the inertia is reduced by reducing the weight of the weights 14 and the air resistance of the weights 14 is reduced. As a result, when the vibration plate 12 vibrates, the vibration of the vibration plate 12 easily shifts from the rising state to the steady state. The period of the rising state can be adjusted by adjusting the size and/or the number of the through holes 14c. Further, by adjusting the size and/or the number of the through holes 14c, it becomes easy to match the vibration of the vibration plate 12 to the frequency of the natural vibration that varies with the mass and size of the body to be vibrated.

Figure 22A:
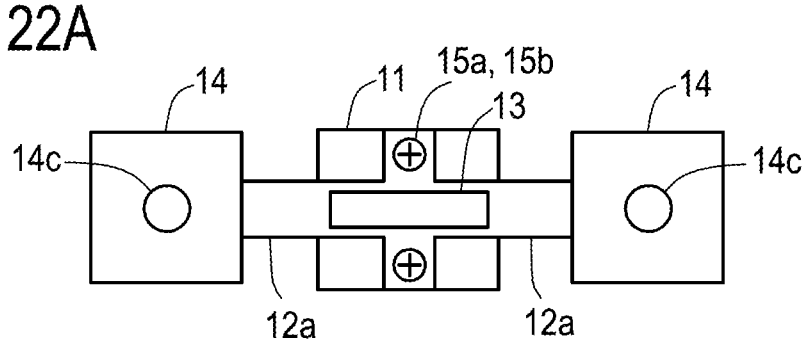
FIGS. 22A to 22D are top view of the tactile vibration generator 1 including the weights 14 with hole/holes 14c, respectively, according to the modified certain embodiment.

FIG. 22A shows a configuration in which the weights 14 have one through hole 14c.

Figure 22B:
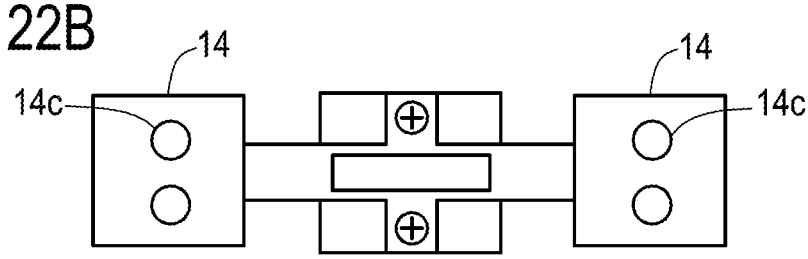

FIG. 22B shows a configuration in which the weights 14 have a plurality of through holes 14c. In this case, since the weights 14 are made lighter, inertia is further reduced, and air resistance of the weights 14 is further reduced.

Figure 22C:
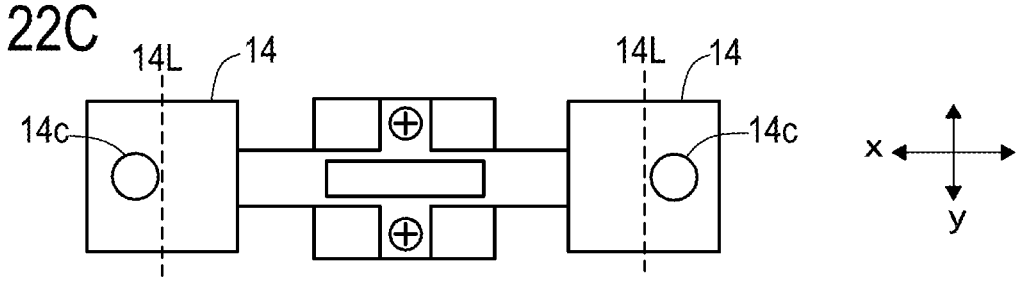

FIG. 22C shows a configuration in which the center of the through hole 14c is outside the center line 14L in the x direction of the weights 14. In this case, when the vibration plate 12 vibrates, the inertia of the part outside the weights 14 whose amplitude is large decreases.

Figure 22D:
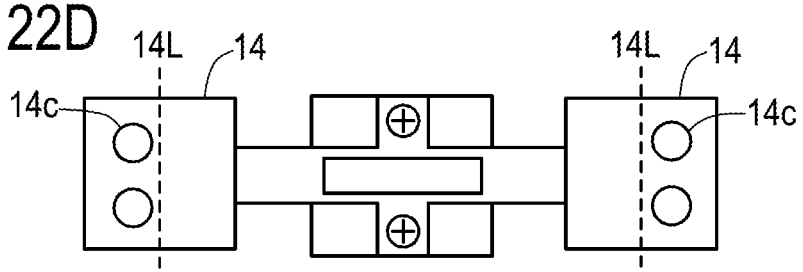

FIG. 22D shows a configuration in which the centers of the plurality of the through holes 14c are outside the center line 14L, respectively, in the x direction of the weights 14. In this case, when the vibration plate 12 vibrates, the inertia of the part outside the weights 14 having large amplitude is further reduced.

The through hole 14c may have various shapes such as a triangular shape, a quadrangular shape, a polygonal shape having a pentagon or more, a circular shape, and an elliptical shape. In view of the fact that the rigidity of the weights 14 is hardly reduced, the shape of the through hole 14c is preferably circular or elliptical.

The length (the length is expressed as Lws) of the weight 14 in the short direction of the vibration plate 14 may be shorter than the length (the length is expressed as Lvs) of the first portion 12a and the 2 second portions 12b in the short direction of the vibration plate 12. In this case, the air resistance of the weight 14 is further reduced, and inertia of the weight 14 is further reduced. The Lws may be ½ or more and less than 1 of the Lvs.

Vibration Plate 12

FIGS. 23A to 23D are top views other embodiments of a tactile vibration generator 1. As shown in these drawings, the first part 12a of the vibration plate 12 may have at least one through hole 12c. In this case, the inertia is reduced by reducing the weight of the first part 12a and the air resistance of the first part 12a is reduced. As a result, when the vibration plate 12 vibrates, the vibration of the vibration plate 12 easily shifts from the rising state to the steady state. The period of the rising state can be adjusted by adjusting the size and/or the number of the through holes 12c. Further, by adjusting the size and/or the number of the through holes 12c, it becomes easy to match the vibration of the vibration plate 12 to the frequency of the natural vibration that varies with the mass and size of the body to be vibrated.

Figure 23A:
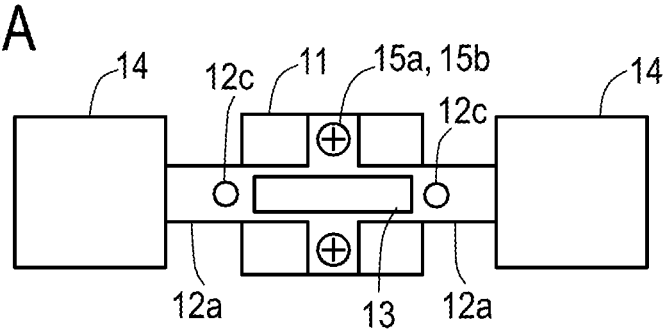
FIGS. 23A to 23D are top view of the tactile vibration generator 1 including the first part 12a with hole/holes 12c, respectively, according to the modified certain embodiment.

FIG. 23A shows a configuration in which the first part 12a has two through holes 12c, which are arranged opposite sides of the vibration actuator 13, respectively, when viewed from above of the tactile vibration generator 1.

Figure 23B:
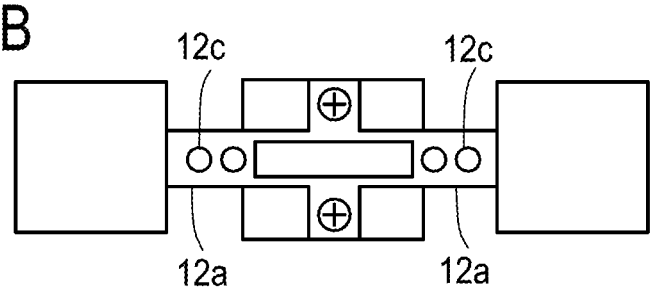

FIG. 23B shows a configuration in which the first part 12a has a plurality of through holes 12c, which are arranged opposite sides of the vibration actuator 13, respectively, when viewed from above of the tactile vibration generator 1. In this case, since the first part 12a is made lighter, the inertia is further reduced and the air resistance of the first part 12a is further reduced.

Figure 23C:
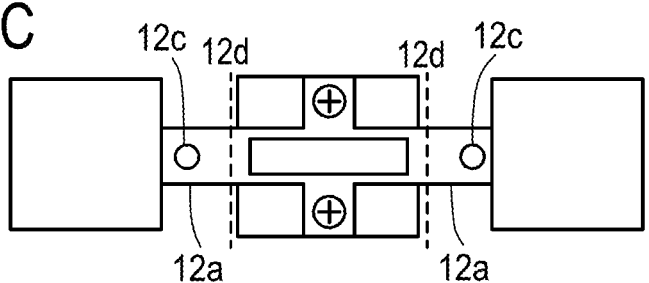

FIG. 23C shows the configuration in which the center of the through hole 12c is outside the center line 12d in the x direction of the first part 12a, when viewed from above of the tactile vibration generator 1. The center line 12d is arranged in the center between the second part 12b and the inner side of the weight 14 along the x direction when the tactile vibration generator 1 is viewed from the above. In this case, when the vibration plate 12 vibrates, the inertia of the outer portions of the first part 12a having a large amplitude decreases.

Figure 23D:
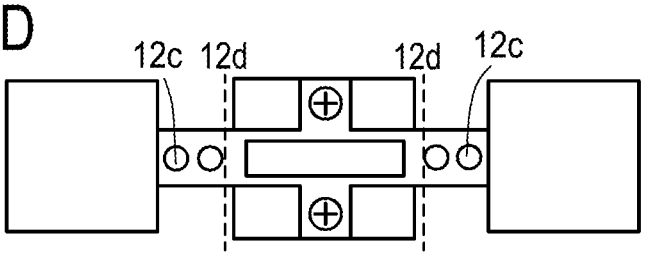

FIG. 23D shows the configuration in which the center of each of the plurality of through holes 12c is outside the center line 12d in the x direction of the first part 12a, when viewed from above of the tactile vibration generator 1. In this case, when the vibration plate 12 vibrates, the inertia of the outer portions of the first part 12a having a large amplitude is further reduced.

The through hole 12c may have various shapes such as a triangular shape, a quadrangular shape, a polygonal shape having a pentagon or more, a circular shape, and an elliptical shape. In view of the fact that the rigidity of the first part 12a is hardly reduced, the shape of the through hole 12c is preferably circular or elliptical.

The vibration plate 12 is in a rising state at the beginning of vibration and then becomes a steady state, but the rising state is preferably as short as possible. The time that elapses between the presentation of a sensory stimulus to a person and the generation of a behavioral response, the so-called response time, is 0.14 to 0.2 seconds. Therefore, since the time for the sensory stimulation to the human to reach the brain through the neural path is about 0.05 to 0.1 seconds, the period of the rising state is preferably 0.1 seconds or less, more preferably 0.05 seconds or less. In this case, the unnatural tactile vibration in the standing state can be shifted to the steady state before reaching the human brain, and the human can be made to feel more natural tactile vibration. Since the steady state period is about 0.5 to 5 seconds, {(period of rising)/(steady-state period)}×100(%) is preferably 20% {100%×(0.1 sec/0.5 sec)} or less. More preferably, it is 10% {100%×(0.05 sec/0.5 sec)} or less.

The Object to be Vibrated by the Tactile Vibration Generator 1

It is desirable to provide a vibration period control part for controlling the period of the rising state and the period of the steady state in the vibration of the vibration plate 12. The vibration period control part may be a control program stored in a ROM (Read Only Memory) section or a RAM (Random Access Memory) section of a drive element such as an IC or a LSI provided in the body to be vibrated, or a ROM section or a RAM section of a drive element separate from the drive element, or a control program stored in the RAM section.

A dummy tactile vibration generator having no vibration actuator 13 may be provided at a portion of the substrate facing the installation portion of the tactile vibration generator 1. Since the dummy tactile vibration generator has the same configuration as the tactile vibration generator 1 device except that the dummy tactile vibration generating device is not provided with the vibration actuator 13, the dummy tactile vibration generator functions as a resonance auxiliary device resonating to the vibration of the vibration plate 12. Thus, natural vibration can be efficiently generated in the body to be vibrated. Further, since the object to be vibrated is vibrated by the resonance of the two tactile vibration generator, the tactile vibration generator can be miniaturized. The dummy tactile vibration generator may be disposed at a point symmetrical to the tactile vibration generator 1 with respect to the central point of the substrate. In this case, the dummy tactile vibration generator 1 easily resonates with the vibration of the vibration plate 12. Two or more dummy tactile vibration generators may be installed.

The tactile vibration generator 1 can be applied to a touch panel and a display device. The touch panel may be of various types such as a matrix switch type, a resistive film type, a surface acoustic wave type (ultra-sonic system), an infrared ray type, an electromagnetic induction type, a surface type capacitance type, and a projection type capacitance type. Of these, the surface capacitance type is preferably used for a touch panel of 10 inch type or larger. The capacitance detection section of the touch panel of the surface capacitance type comprises, for example, three layers of a transparent coating layer, a transparent conductive film, and a glass substrate, and the transparent conductive film is connected to electrodes provided on four parts of the glass substrate. A uniform electric field is formed on the surface of the transparent coating layer on the glass substrate by the transparent conductive film. When an electrostatic conductor such as a human finger touches the surface of the capacitance detection part, a weak current from the drive circuit forms a closed circuit in an equivalent circuit form between the peripheral environment such as the ground and the drive circuit via the four corner electrodes, the transparent conductive film, the transparent coating layer and the finger. The position of the finger or the like can be discriminated by calculating the ratio of current in the four corner electrodes by the drive circuit. The touch panel of the surface type capacitance system can be manufactured at low cost because of its simple structure, and is suitably used for a large-sized touch panel.

In the projection type capacitance system, multiple inspections of the contact part by fingers and the like are possible. For example, the capacitance detecting section of the projection type capacitance type touch panel includes a substrate such as a glass substrate having a transparent insulator layer and a transparent electrode layer below the transparent insulator layer and mounting a driving circuit such as a control IC and a control LSI. The transparent electrode layer includes a first layer having a mosaic first detection electrode pattern made of ITO or the like and formed so as to extend in a predetermined direction, and a second layer having a mosaic second detection electrode pattern made of ITO or the like and formed so as to extend in a direction orthogonal to the predetermined direction under the first layer. When an electrostatic conductor such as a human finger touches the surface of the capacitance detection part, the position of the contact part can be detected two-dimensionally with high accuracy by detecting a change in capacitance of about 1 pF in the first and second detection electrode patterns in the vicinity thereof. In addition, since the electrical resistance of the first and second detection electrode patterns increases as the length of the first and second detection electrode patterns increases, the resistance of the first and second detection electrode patterns can be reduced by connecting the first and second detection electrode patterns to the metal wiring to cope with an increase in size. This projection type electrostatic capacitance type touch panel can perform multiple inspections by a control IC, a control LSI, or the like for detecting the position of the contact portion, and is highly practical, so that it can be suitably used for a tablet type portable terminal or the like.

Examples of the display device include a liquid crystal display device, an organic EL (Organic Electro-Luminescence) display device, an inorganic EL display device, a PDP (Plasma Display), and an LED (Light Emitting Diode) display device.

Further, the tactile vibration generator 1 of the present invention can be applied to various electronic devices including a touch panel and a display device. Such electronic devices include digital display watches such as smartwatches, automobile route guidance systems (car navigation system), ship route guidance systems, aircraft route guidance systems, smart phone terminals, cellular phones, tablet terminals, personal digital assistants (PDA), video cameras, digital still cameras, electronic notebooks, electronic books, electronic dictionaries, personal computers, copying machines, game machine terminals, televisions, commodity display tags, price display tags, industrial programmable display devices, car audio, digital audio players, facsimile machines, printers, automatic teller machines (ATM), vending machines, in-vehicle advertising display devices such as in trains, and guide display devices installed in stations and airports.

Although the embodiments of the present disclosure have been described above in detail, the present disclosure is not limited thereto and may be altered or amended in a variety of manners without departing from the substance of the present disclosure.

REFERENCE SIGNS LIST 1 tactile vibration generator
11 supporting block
11a surface of the supporting block
11b protrusion
11c protrusion
11d channel
11e recess
11f groove
12 vibration plate
12a first part
12b second part
13 vibration actuator
14 weight
14a first plate weight
14b second plate weight
15a, 15b fixing element

What is claimed is:

1. A tactile vibration generator comprising:
a supporting block;
a vibration plate, the vibration plate comprising a first part that is not in contact with the supporting block and a second part that is fixed to the supporting block; and
a vibration actuator attached to a surface of the first part,
wherein the second part is located at a central part of the vibration plate, and
the first part extends beyond two opposite sides of the supporting block when viewed from a side of the supporting block to which the second part is fixed, and weights are attached to both ends of the first part, respectively.

2. The tactile vibration generator according to claim 1, wherein the first part is vibrated in a direction of flexural vibration of the vibration actuator when the flexural vibration of the vibration actuator is generated.

3. The tactile vibration generator according to claim 2, wherein the vibration actuator is not in contact with the supporting block.

4. The tactile vibration generator according to claim 1, wherein the vibration actuator is just one vibration actuator.

5. The tactile vibration generator according to claim 1, wherein the vibration actuator is a piezoelectric element.

6. The tactile vibration generator according to claim 1, wherein each of the first part and second part has an elongated shape, and the first part and the second part are at substantially right angles to each other.

7. The tactile vibration generator according to claim 6, wherein the first part and the second part are at substantially right angles to each other substantially at the middle of the first part and the second part.

8. The tactile vibration generator according to claim 6, wherein the length of the first part in a longitudinal direction of the first part is longer than the length of the second part in a longitudinal direction of the second part.

9. The tactile vibration generator according to claim 1, wherein the vibration actuator has an elongated shape and extends in a same direction as the first part.

10. The tactile vibration generator according to claim 1, wherein each of the two weights comprises a first plate weight and a second plate weight, and the first plate weight and the second plate weight sandwich an end of the first part.

11. The tactile vibration generator according to claim 10, wherein a thickness of the first plate weight is different from a thickness of the second plate weight.

12. The tactile vibration generator according to claim 1, wherein the second part is fixed to the supporting block by two fixing elements, and the two fixing elements are arranged at opposite sides of the vibration actuator.

13. The tactile vibration generator according to claim 12, wherein the second part comprises two holes, and the two fixing elements are screws.

14. The tactile vibration generator according to claim 13, wherein the supporting block comprises two holes, and each of the two holes of the supporting block corresponds to each of the two holes of the second part.

15. The tactile vibration generator according to claim 1, wherein the vibration actuator is attached to a first surface of the first part, such that the vibration actuator and the supporting block are arranged at opposite sides of the first part.

16. The tactile vibration generator according to claim 14, wherein the supporting block has two protrusions, and the two holes of the supporting block are formed on the two protrusions respectively.

17. The tactile vibration generator according to claim 1, wherein the supporting block comprises a channel in a surface of the supporting block, the channel extending along the first part, and the vibration actuator is attached to a second surface of the first part such that the vibration actuator is arranged in the channel.

18. The tactile vibration generator according to claim 1, wherein the vibration actuator is attached to the surface of the first part by glue.

19. The tactile vibration generator according to claim 1, wherein a rigidity of the supporting block is lower than a rigidity of the vibration actuator.

20. The tactile vibration generator according to claim 19, wherein the supporting block comprises an isotropic elastic member.

21. The tactile vibration generator according to claim 1, wherein a rigidity of the vibration plate is lower than a rigidity of the vibration actuator.

22. The tactile vibration generator according to claim 1, wherein the supporting block comprises a recess and/or a groove on a surface of the supporting block different from a surface on which the second part is fixed.

23. A touch panel device comprising the tactile vibration generator according to claim 1.

24. A display panel comprising the tactile vibration generator according to claim 1.

* * * * *